(12) United States Patent
Il et al.

(10) Patent No.: US 11,854,957 B2
(45) Date of Patent: Dec. 26, 2023

(54) INTEGRATED CIRCUIT DEVICE, DEVICE, AND MANUFACTURING METHOD

(71) Applicant: Seiko Epson Corporation, Tokyo (JP)

(72) Inventors: Naoki Il, Suwa (JP); Yosuke Itasaka, Minowa (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/705,668

(22) Filed: Mar. 28, 2022

(65) Prior Publication Data

US 2022/0310504 A1 Sep. 29, 2022

(30) Foreign Application Priority Data

Mar. 29, 2021 (JP) .................... 2021-054805

(51) Int. Cl.
| | |
|---|---|
| H01L 23/50 | (2006.01) |
| H03H 9/05 | (2006.01) |
| H03H 9/10 | (2006.01) |
| H03H 9/17 | (2006.01) |
| H03B 5/36 | (2006.01) |
| H03H 3/02 | (2006.01) |
| H01L 23/00 | (2006.01) |

(52) U.S. Cl.
CPC .............. *H01L 23/50* (2013.01); *H03B 5/36* (2013.01); *H03H 3/02* (2013.01); *H03H 9/0557* (2013.01); *H03H 9/1021* (2013.01); *H03H 9/178* (2013.01); *H01L 24/05* (2013.01); *H01L 24/13* (2013.01); *H01L 24/16* (2013.01); *H01L 24/81* (2013.01); *H01L 2224/05083* (2013.01); *H01L 2224/05124* (2013.01); *H01L 2224/05155* (2013.01); *H01L 2224/05164* (2013.01); *H01L 2224/05624* (2013.01); *H01L 2224/05644* (2013.01); *H01L 2224/13144* (2013.01); *H01L 2224/16227* (2013.01); *H01L 2224/81191* (2013.01); *H01L 2224/81206* (2013.01)

(58) Field of Classification Search
CPC ......... H01L 23/50; H01L 24/05; H01L 24/13; H01L 24/16; H03B 5/36; H03H 3/02; H03H 9/0557; H03H 9/1021; H03H 9/178

See application file for complete search history.

(56) References Cited

U.S. PATENT DOCUMENTS

| | | | | |
|---|---|---|---|---|
| 2015/0294947 A1* | 10/2015 | Tomita | .............. | H01L 23/49562 257/773 |
| 2017/0062292 A1* | 3/2017 | Yajima | .................... | H01L 24/06 |

FOREIGN PATENT DOCUMENTS

JP H06-333974 A 12/1994

\* cited by examiner

*Primary Examiner* — Jeffrey M Shin
(74) *Attorney, Agent, or Firm* — Harness, Dickey & Pierce, P.L.C.

(57) ABSTRACT

The integrated circuit device includes: a pad that has a shape having a longitudinal direction and a lateral direction; a circuit that overlaps the pad in a plan view, and that is electrically coupled to the pad; a lead-out wiring that is led out from an outer edge on a longitudinal side of the pad along the lateral direction of the pad; and a via group that electrically couples the lead-out wiring and a wiring of the circuit and that does not overlap the pad in the plan view.

20 Claims, 13 Drawing Sheets

INTEGRATED CIRCUIT DEVICE, DEVICE, AND MANUFACTURING METHOD

The present application is based on, and claims priority from JP Application Ser. No. 2021-054805, filed Mar. 29, 2021, the disclosure of which is hereby incorporated by reference herein in its entirety.

BACKGROUND

1. Technical Field

The present disclosure relates to an integrated circuit device, a device, and a manufacturing method.

2. Related Art

In an integrated circuit device, a pad for external coupling is provided. For example, JP-A-6-333974 discloses a method of forming a pad provided along a side edge of an integrated circuit device into a rectangular shape having a long side along a vibration direction of an ultrasonic wave during wire bonding. In JP-A-6-333974, a pad shape corresponding to a coupling portion of wire bonding having a substantially elliptical shape elongated in the vibration direction of the ultrasonic wave in a plan view is provided, thereby realizing a reduction in size of the integrated circuit device.

However, in a configuration of JP-A-6-333974, an appropriate method of leading out wiring to a circuit when the circuit is disposed so as to overlap the pad in the plan view has not been proposed.

SUMMARY

An aspect of the present disclosure relates to an integrated circuit device including: a pad that has a shape having a longitudinal direction and a lateral direction; a circuit that overlaps the pad in a plan view, and that is electrically coupled to the pad; a lead-out wiring that is led out from an outer edge on a longitudinal side of the pad along the lateral direction of the pad; and a via group that electrically couples the lead-out wiring and a wiring of the circuit and that does not overlap the pad in the plan view.

Another aspect of the present disclosure relates to a manufacturing method for a device including an integrated circuit device and a package in which the integrated circuit device is housed. The manufacturing method includes: a manufacturing step of the integrated circuit device; and a mounting step of mounting the integrated circuit device on the package. In the manufacturing step, a pad having a shape having a longitudinal direction and a lateral direction, a circuit overlapping the pad in a plan view and electrically coupled to the pad, a lead-out wiring led out from an outer edge on a longitudinal side of the pad along the lateral direction of the pad, and a via group electrically coupling the lead-out wiring and a wiring of the circuit and not overlapping the pad in the plan view are formed on an active surface of the integrated circuit device. In the mounting step, a bump is formed on the pad of the integrated circuit device, the integrated circuit device is disposed such that the active surface faces a surface of the package, and a terminal provided on the surface of the package and the bump formed on the pad are coupled by ultrasonic bonding in which the longitudinal direction of the pad serves as a vibration direction.

DESCRIPTION OF EXEMPLARY EMBODIMENTS

Hereinafter, an embodiment will be described. The present embodiment described below does not unduly limit the content of the claims. Moreover, not all of the configurations described in the present embodiment are essential constituent elements.

1. Lead-Out Wiring of Pad

Figure 1:
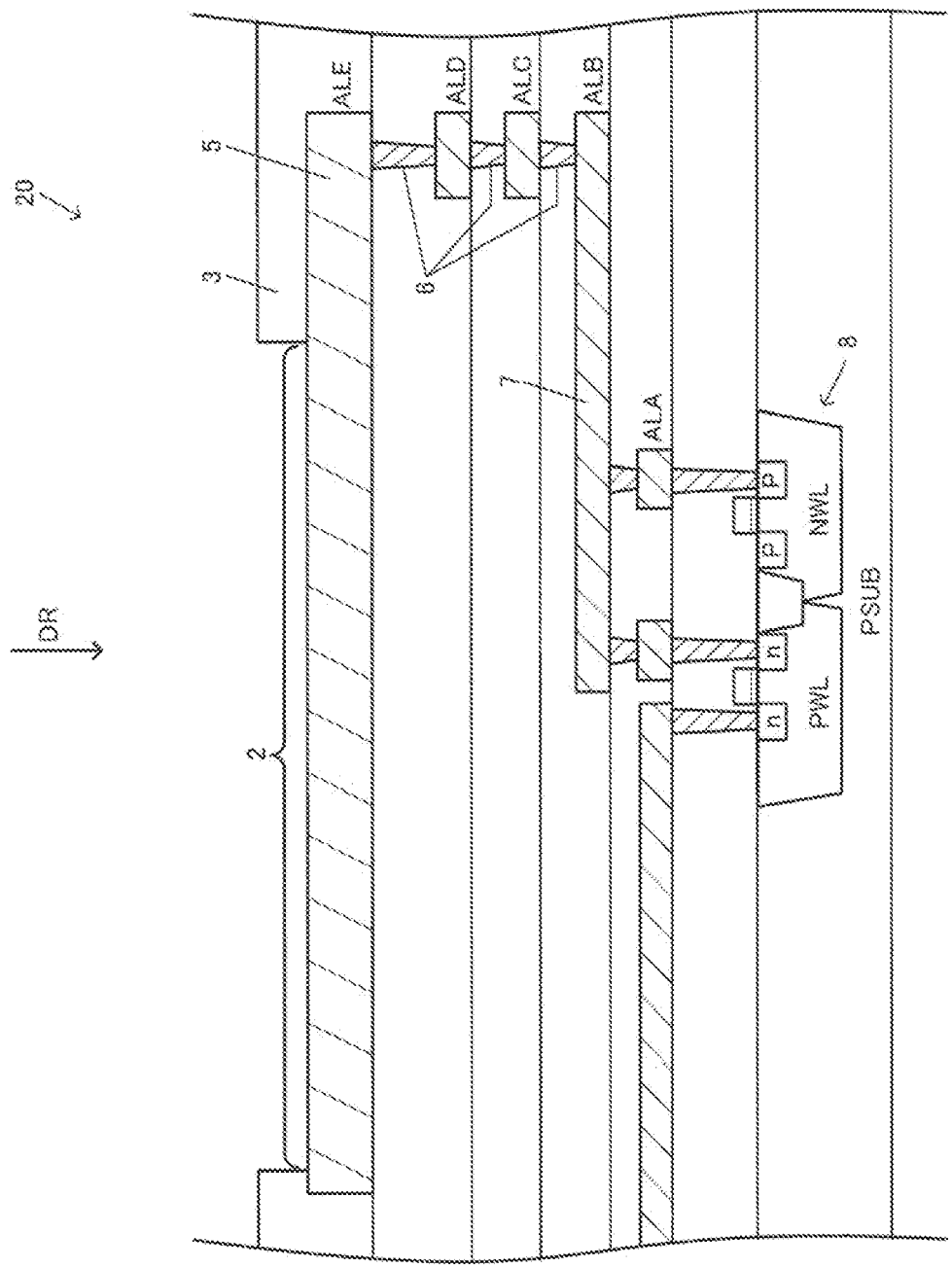
FIG. 1 is a cross-sectional view of an integrated circuit device according to an embodiment in a pad region.
Figure 2:
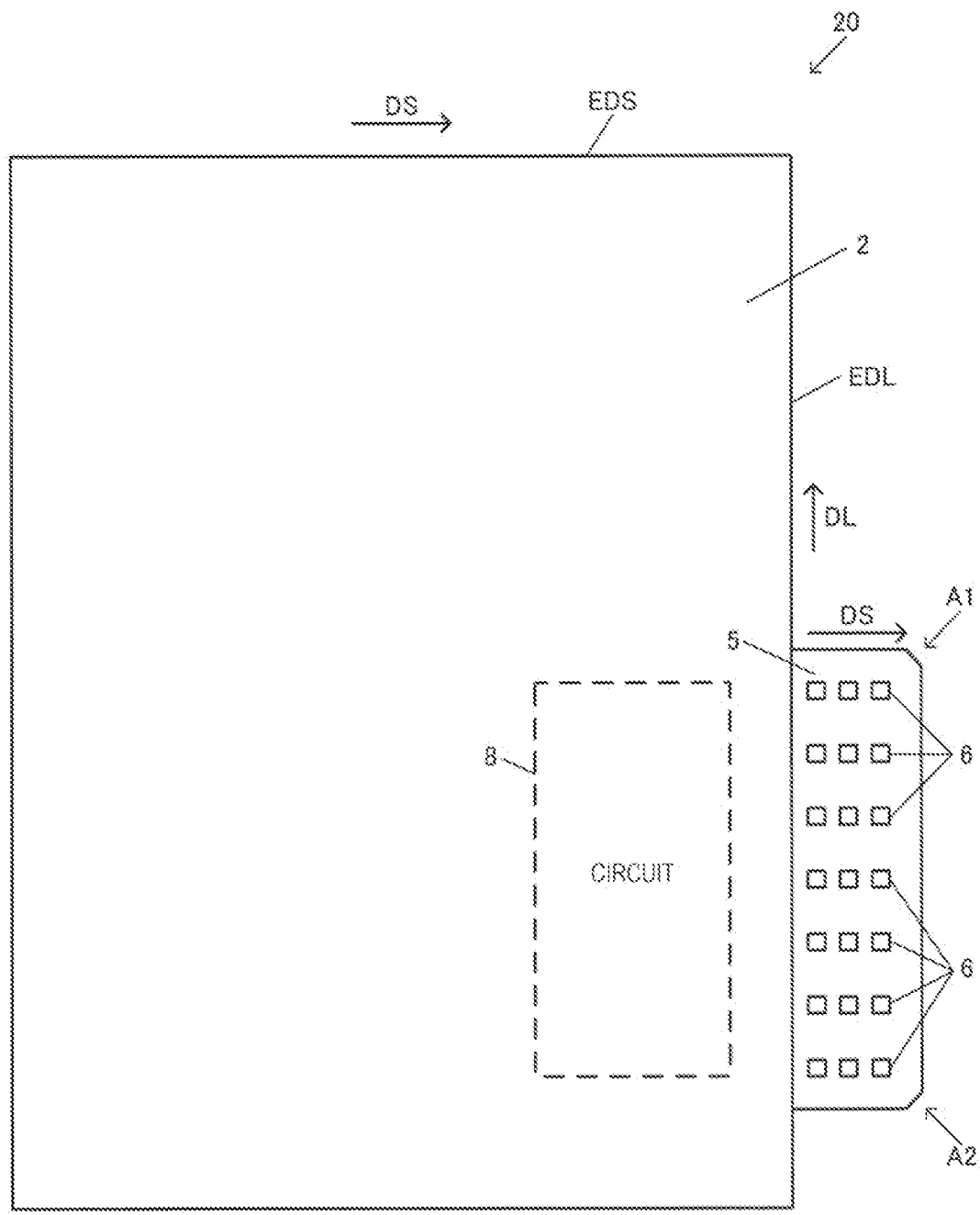
FIG. 2 is a plan view of the integrated circuit device according to the present embodiment in the pad region.

FIG. 1 shows a cross-sectional view of an integrated circuit device 20 according to the present embodiment in a pad region, and FIG. 2 shows a plan view thereof in the pad region. The integrated circuit device 20 according to the present embodiment includes a pad 2, a lead-out wiring 5, and a via group 6. As shown in FIG. 2, the pad 2 is a pad having a shape having a longitudinal direction and a lateral direction. For example, when the pad 2 has a quadrilateral shape, the pad 2 has a rectangular shape having long sides and short sides. The shape of the pad 2 is not limited to a rectangular shape, may be, for example, a shape including an oval or an ellipse, and may be, for example, a polygon such as a hexagon or an octagon having five or more sides, a substantially elliptical shape, or the like. For example, corner portions of the pad 2 may have chamfered shapes, whereby stress concentration and the like on the corner portions can be alleviated. A region of the pad 2 is a region in a metal layer forming the pad 2 that is exposed on an active surface of the integrated circuit device 20. For example, in FIG. 1, the pad 2 is formed of a metal layer ALE such as aluminum in an uppermost layer. In the metal layer ALE, a region of an opening portion exposed from a passivation film 3, which is an oxide film formed to cover the metal layer ALE, serves as the region of the pad 2.

In FIGS. 1 and 2, a circuit 8 that overlaps the pad 2 and is electrically coupled to the pad 2 in a plan view is provided. The circuit 8 is, for example, a functional circuit having a predetermined function. The circuit includes, for example, a plurality of circuit elements. The circuit elements are active elements such as a transistor or passive elements such as a resistor or a capacitor. For example, in FIG. 1, the circuit 8 includes an N-type transistor formed in a P-type well PWL and a P-type transistor formed in an N-type well NWL. FIG. 1 schematically shows an arrangement relationship between the pad 2 and the circuit 8. Actually, a layout area of a transistor or the like of the circuit 8 with respect to a layout area of the pad 2 is sufficiently small, and a necessary number of circuit elements such as transistors forming the circuit 8 are disposed below the pad 2.

The plan view is a plan view in a direction DR of FIG. 1, and is, for example, a plan view seen from a direction orthogonal to a semiconductor substrate forming the integrated circuit device 20. As shown in FIG. 2, the circuit 8 is disposed so as to overlap the pad 2 in the plan view. For example, when the direction DR toward the semiconductor substrate is a downward direction, the circuit 8 is disposed below the pad 2. The pad 2 and the circuit 8 are electrically coupled via the lead-out wiring 5, the via group 6, and the like. In this way, a layout area of the integrated circuit device 20 can be reduced by disposing the circuit 8 so as to overlap the pad 2 in the plan view.

As shown in FIG. 2, the lead-out wiring 5 is a wiring led out from an outer edge EDL on a longitudinal side of the pad 2 along a lateral direction DS of the pad 2. For example, in FIG. 2, the outer edge EDL is an outer edge along a longitudinal direction DL of the pad 2, and an outer edge EDS is an outer edge along the lateral direction DS of the pad 2. When the pad 2 has a rectangular shape, the outer edge EDL on the longitudinal side is a long side of the pad 2, and the longitudinal direction DL is a direction along the long side. The outer edge EDS on a lateral side is a short side of the pad 2, and the lateral direction DS is a direction along the short side. As shown in FIG. 1, the lead-out wiring 5 is formed of the metal layer ALE in the same layer as the pad 2. For example, the lead-out wiring 5 is a wiring led out by extending the metal layer ALE of the pad 2 along the lateral direction DS of the pad 2.

The via group 6 electrically couples the lead-out wiring 5 and a wiring 7 of the circuit 8. The via group 6 is provided so as not to overlap the pad 2 in the plan view. For example, the via group 6 electrically coupling the lead-out wiring 5 and the wiring 7 is not disposed below the pad 2, but is disposed below the lead-out wiring 5 that is led out from the outer edge EDL of the pad 2 in the lateral direction DS. For example, in FIGS. 1 and 2, the integrated circuit device 20 includes five metal layers ALA to ALE. The metal layers ALA to ALE are, for example, metal layers of aluminum or an aluminum alloy. The number of metal layers is not limited to five, and may be four or less, or six or more. The via group 6 includes a plurality of vias that couple these metal layers. The via is also called, for example, a via wiring, and is formed of a via hole and a metal plug. For example, the via group 6 includes a via coupling the metal layer ALE and a metal layer ALD, a via coupling the metal layer ALD and a metal layer ALC, a via coupling the metal layer ALC and a metal layer ALB, and the like. These plurality of vias are provided side by side along the directional DR below the lead-out wiring 5, for example. The metal layer ALE forming the lead-out wiring 5 and the metal layer ALB forming the wiring 7 are electrically coupled to each other by the via group 6 including the plurality of vias. One end of the wiring 7 is coupled to a via of the via group 6, and the other end thereof is electrically coupled to the circuit 8. For example, the other end of the wiring 7 is coupled to the circuit elements constituting the circuit 8. For example, the wiring 7 is electrically coupled to a drain, a source, a gate, or the like of a transistor that is the circuit element, or one end of a resistor or a capacitor that is the passive element. In FIG. 1, the wiring 7 formed of the metal layer ALB is illustrated, but a wiring electrically coupling the via group 6 and the circuit 8 may be, for example, a wiring formed of other metal layer such as the metal layer ALA and the metal layer ALC.

As described above, in the present embodiment, the circuit 8 is disposed so as to overlap the pad 2 in the plan view. Accordingly, the circuit 8 can be disposed by effectively utilizing the region of the pad 2, so that the area of the integrated circuit device 20 can be reduced. That is, by disposing the circuit 8 in the region of the pad 2, the area of the integrated circuit device 20 can be reduced by the area of the circuit 8 as compared with a case where the circuit 8 is disposed outside the region of the pad 2. Since the pad 2 has the shape having the longitudinal direction and the lateral direction, even when a force along the longitudinal direction of the pad 2 acts during the mounting of the integrated circuit device 20, the occurrence of problems such as a short circuit or a wire-breakage of a wiring can be prevented. For example, when ultrasonic bonding as will be described later is performed during the mounting, by setting a vibration direction of an ultrasonic wave to be in the longitudinal direction of the pad 2, the occurrence of the short circuit or the like of the wiring due to the vibration of the ultrasonic wave can be prevented. In the present embodiment, the lead-out wiring 5 is further led out along the lateral direction DS of the pad 2 from the outer edge EDL on the longitudinal side of the pad 2, and the lead-out wiring 5 and the wiring 7 of the circuit 8 are electrically coupled by the via group 6. In this way, even when the force along the longitudinal direction of the pad 2 acts during the mounting of the integrated circuit device 20, a risk of the occurrence of the short circuit, the wire-breakage, or the like due to damage to the lead-out wiring 5 or the via group 6 can be prevented. Therefore, it is possible to provide the integrated circuit device 20 that is capable of preventing damage to the lead-out wiring 5 or the via group 6 electrically coupling the pad 2 to the circuit 8 disposed so as to overlap the pad 2. That is, it is possible to realize an appropriate lead-out wiring 5 electrically coupling the pad 2 and the circuit 8 while reducing the area of the integrated circuit device 20 by disposing the circuit 8 so as to overlap with the pad 2. As a method of a comparative example of the present embodiment, a method is also conceivable in which a via is provided directly below the pad 2, and the pad 2 and the circuit 8 are coupled via the via. However, when a via is disposed directly below the pad 2, problems such as peeling off the metal layer ALE of the pad 2 or damage to the via may occur. In this regard, in the present embodiment, the via group 6 is provided at a location that does not overlap the pad 2 in the plan view, and thus the occurrence of such a problem can be prevented.

As shown in FIG. 1, the wiring 7 is a wiring of the metal layer ALB below the metal layer ALE of the pad 2, and the wiring 7 partially overlaps the pad 2 in the plan view. By providing such a wiring 7, the lead-out wiring 5 from the pad 2 is coupled to one end of the wiring 7 via the via group 6, and the other end of the wiring 7 is coupled to the circuit 8, so that the pad 2 can be electrically coupled to the circuit elements of the circuit 8 disposed so as to overlap the pad 2. Therefore, the circuit 8 electrically coupled to the pad 2 can be disposed so as to overlap the pad 2 in the plan view, and the area of the integrated circuit device 20 can be reduced.

In FIG. 1, the wiring 7 is a wiring of the metal layer ALB that is disposed at an interval of one or more layers than the metal layer ALE of the pad 2. For example, the wiring 7 of the circuit 8 is formed by the metal layer ALB disposed at the interval of one or more layers than the metal layer ALE of the pad 2, instead of the metal layer ALD directly below the metal layer ALE of the pad 2. Although the wiring 7 is formed by the metal layer ALB in FIG. 1, the wiring 7 may be formed by the metal layer ALC or the metal layer ALA, which is disposed at the interval of one or more layers than the metal layer ALE of the pad 2. For example, when the wiring 7 of the circuit 8 is formed by the metal layer ALD directly below the metal layer ALE of the pad 2, the wiring 7 may be damaged in a case where a load is applied to the pad 2 during the mounting or the like, and problems such as the wire-breakage may occur. In this regard, when the wiring 7 of the circuit 8 is formed by the metal layer ALB, the metal layer ALC, or the metal layer ALA, which is disposed at the interval of one or more layers than the metal layer ALE of the pad 2, the occurrence of problems due to damage to the wiring 7 can be prevented, and reliability and the like can be improved. For example, in the present embodiment, since the lead-out wiring 5 from the pad 2 and the wiring 7 are electrically coupled to each other by the plurality of vias of the via group 6, the wiring 7 of the circuit 8 can be formed by the metal layer ALB, the metal layer ALC, or the metal layer ALA, which is disposed at the interval of one or more layers than the metal layer ALE of the pad 2.

As shown in FIG. 2, the lead-out wiring 5 has a shape whose longitudinal direction is the longitudinal direction DL of the pad 2. For example, the lead-out wiring 5 has a shape in which the longitudinal direction DL of the pad 2 is the longitudinal direction thereof and the lateral direction DS of the pad 2 is a lateral direction thereof. For example, in FIG. 2, the longitudinal direction DL of the pad 2 is a vertical direction on a paper surface, the lateral direction DS of the pad 2 is a horizontal direction on the paper surface, and a length of the pad 2 in the vertical direction is longer than that in the horizontal direction. Similarly, the lead-out wiring 5 has a shape in which a length thereof in the vertical direction is longer than that in the horizontal direction. In this way, the lead-out wiring 5 having a short length in the horizontal direction is led out from the outer edge EDL on the longitudinal side of the pad 2, and thus the lead-out wiring 5 can be coupled to the wiring 7 of the circuit 8 via the via group 6. By increasing the length of the lead-out wiring 5 in the vertical direction, it is possible to increase the number of vias provided in a region of the lead-out wiring 5, and it is possible to realize improvement in resistance to static electricity, reduction in impedance of the wiring, and the like.

As shown in FIG. 2, the plurality of vias of the via group 6 are provided side by side along the longitudinal direction of the lead-out wiring 5. For example, in FIG. 2, a via group having a plurality of rows of vias is provided along the longitudinal direction of the lead-out wiring 5, and specifically, three rows of vias are provided. The number of rows of the vias is not limited to three, and may be one or four or more. In this way, by providing the plurality of vias of the via group 6 side by side along the longitudinal direction of the lead-out wiring 5, it is possible to increase the number of vias of the via group 6 for electrically coupling the lead-out wiring 5 and the wiring 7 of the circuit 8. Accordingly, it is possible to realize the improvement in the resistance to static electricity, the reduction in the impedance of the wiring, and the like, and it is possible to improve the reliability and the like of the integrated circuit device 20.

As shown in arrows A1 and A2 of FIG. 2, the lead-out wiring 5 has a shape in which corner portions are chamfered in the plan view. For example, the lead-out wiring 5 has a substantially rectangular shape in which the vertical direction is a long-side direction thereof and the horizontal direction is a short-side direction thereof on the paper surface of FIG. 2 by chamfering the corner portions as shown in the arrows A1 and A2. In FIG. 2, the corner portion in an upper right direction indicated by the arrow A1 and the corner portion in a lower right direction indicated by the arrow A2 are chamfered. In this way, by chamfering the corner portions of the lead-out wiring 5, for example, when static electricity is applied to the pad 2, electric charge is concentrated on the corner portions, and the occurrence of breakdown due to heat generation or the like can be prevented. Accordingly, the reliability and the like of the integrated circuit device 20 can be improved.

Figure 3:
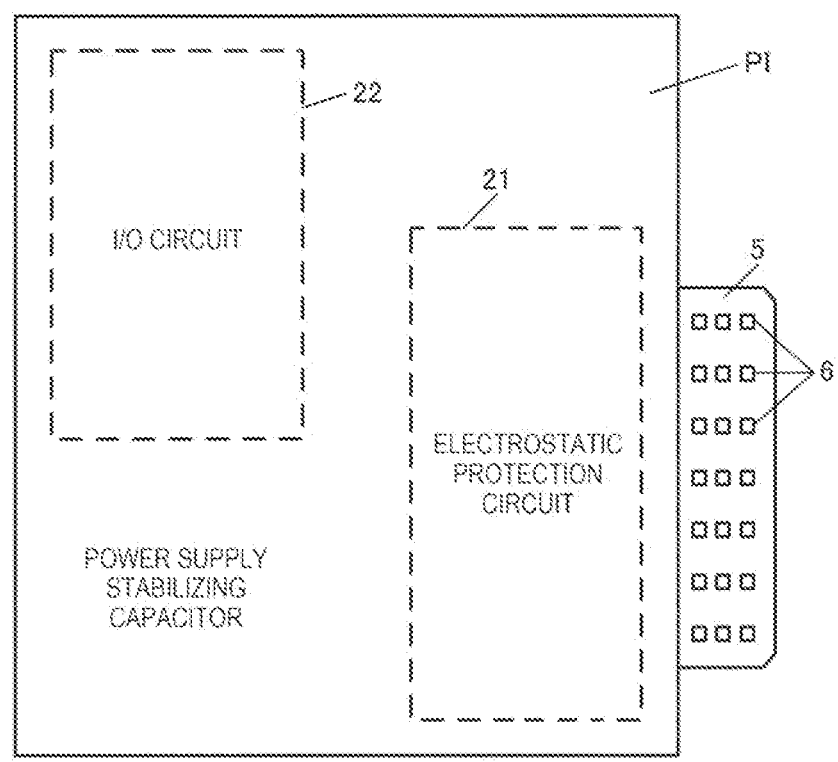
FIG. 3 is a layout arrangement example of an input pad.

The pad 2 according to the present embodiment is, for example, an input pad PI to which an input signal is input as shown in FIG. 3. The circuit 8 disposed so as to overlap the input pad PI in the plan view is an I/O circuit 22 to which an input signal is input from the input pad PI. The I/O circuit 22 includes an input buffer circuit and the like that receives and buffers an input signal, and outputs the buffered input signal to an internal circuit of the integrated circuit device 20. In this way, the input signal to the input pad PI can be input to the I/O circuit 22 via the lead-out wiring 5, the via group 6, and the wiring 7. The input pad PI has a shape having a longitudinal direction and a lateral direction, and the lead-out wiring 5 is led out from the outer edge EDL on a longitudinal side of the input pad PI. Therefore, even when a force along the longitudinal direction of the input pad PI acts during the mounting of the integrated circuit device 20 or the like, the occurrence of problems such as the short circuit, or damage to the lead-out wiring 5 and the via group 6 can be prevented. Since the I/O circuit 22 can be disposed by effectively utilizing a region of the input pad PI, the area of the integrated circuit device 20 can be reduced as compared with a case where the I/O circuit 22 is disposed outside the region of the input pad PI. In FIG. 3, an electrostatic protection circuit 21, a power supply stabilizing capacitor, and the like are also disposed so as to overlap the input pad PI in the plan view. Accordingly, the area of the integrated circuit device 20 in which the region of the input pad PI is effectively utilized can be further reduced.

Figure 4:
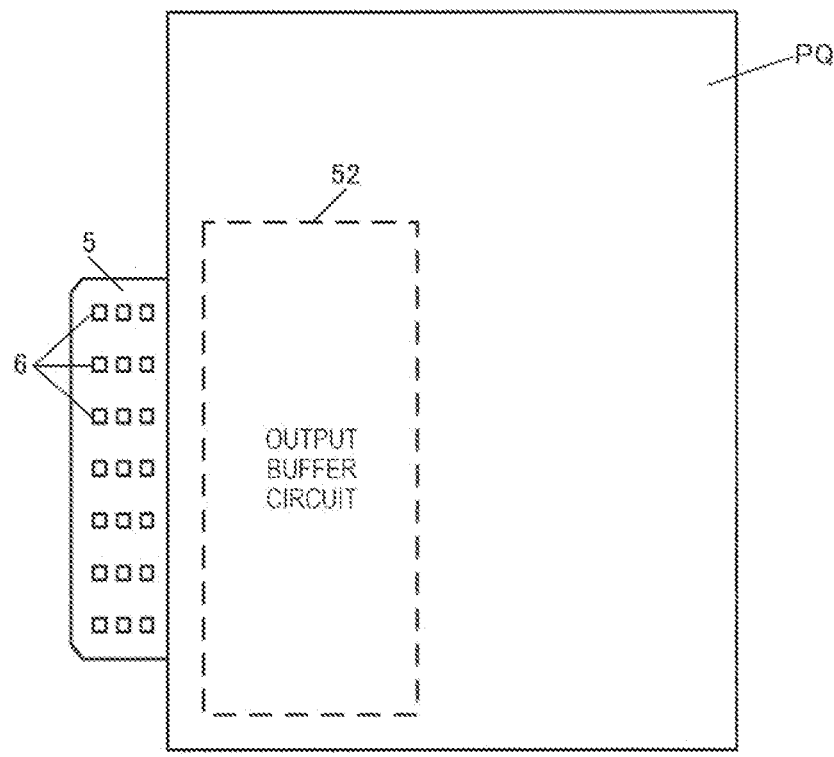
FIG. 4 is a layout arrangement example of an output pad.

For example, as shown in FIG. 4, the pad 2 according to the present embodiment is an output pad PQ that outputs an output signal. The circuit 8 disposed so as to overlap the output pad PQ in the plan view is an output buffer circuit 52 that outputs an output signal to the output pad PQ. The output buffer circuit 52 buffers an output signal from the internal circuit of the integrated circuit device 20 and outputs the output signal to the output pad PQ, for example. In this way, the output signal from the output buffer circuit 52 can be output from the output pad PQ via the wiring 7, the via group 6, and the lead-out wiring 5. The output pad PQ has a shape having a longitudinal direction and a lateral direction, and the lead-out wiring 5 is led out from the outer edge EDL on a longitudinal side of the output pad PQ. Therefore, even when a force along the longitudinal direction of the output pad PQ acts during the mounting of the integrated circuit device 20 or the like, the occurrence of problems such as the short circuit, or damage to the lead-out wiring 5 and the via group 6 can be prevented. Since the output buffer circuit 52 can be disposed by effectively utilizing a region of the output pad PQ, the area of the integrated circuit device 20 can be reduced. When the output buffer circuit 52 outputs an output signal such as a clock signal of a high frequency, the output buffer circuit 52 becomes a noise source. In this regard, in FIG. 4, since the output pad PQ is disposed so as to cover the output buffer circuit 52 serving as the noise source, a metal layer of the output pad PQ serves as a shield layer, and it is possible to prevent the noise source from reaching other circuits of the integrated circuit device 20. Therefore, it is also possible to prevent performance degradation of the integrated circuit device 20 due to noise from the output buffer circuit 52.

Figure 5:
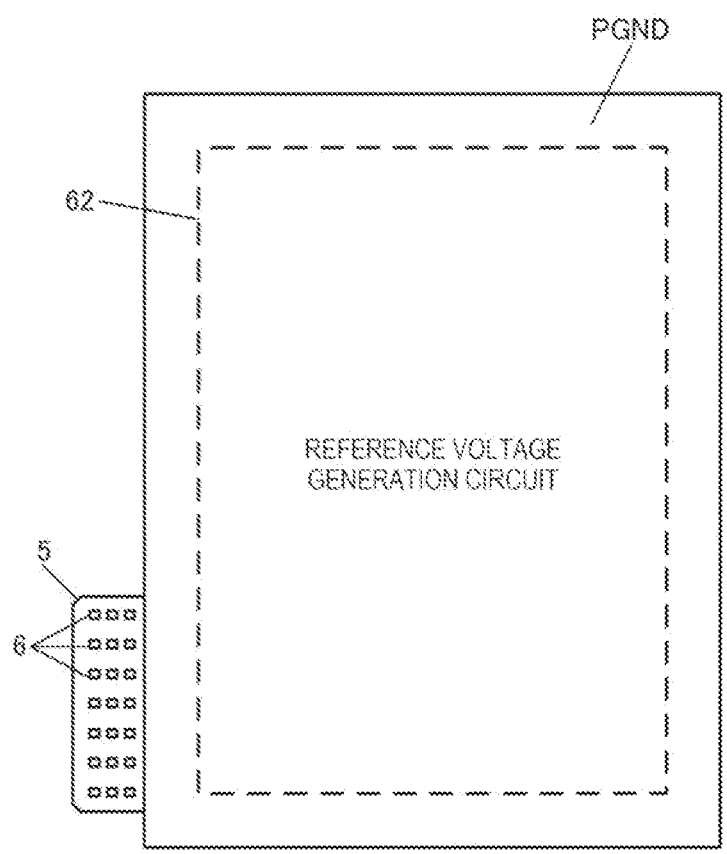
FIG. 5 is a layout arrangement example of a ground pad.

For example, as shown in FIG. 5, the pad 2 according to the present embodiment is a ground pad PGND to which ground is supplied. The circuit 8 disposed so as to overlap the ground pad PGND in the plan view is a reference voltage generation circuit 62 that generates a reference voltage. The reference voltage generation circuit 62 generates a reference voltage that is constant even when, for example, a power supply voltage or a temperature changes. For example, the reference voltage generation circuit 62 generates a reference voltage for generating at least one of a bias current, a bias voltage, or a regulated power supply voltage. For example, the integrated circuit device 20 includes an analog circuit, and the reference voltage generation circuit 62 generates a reference voltage for generating a bias current and a bias voltage of the analog circuit. The integrated circuit device 20 includes a regulator. The regulator generates a regulated power supply voltage of a constant voltage obtained by stepping down the power supply voltage based on the reference voltage generated by the reference voltage generation circuit 62, and supplies the generated regulated power supply voltage to each circuit block of the integrated circuit device 20. With a layout arrangement as shown in FIG. 5, a ground voltage supplied to the ground pad PGND can be supplied to the reference voltage generation circuit 62 via the lead-out wiring 5, the via group 6, and the wiring 7. The ground pad PGND has a shape having a longitudinal direction and a lateral direction. Since the lead-out wiring 5 is led out from the outer edge EDL on a longitudinal side of the ground pad PGND, even when a force along the longitudinal direction of the ground pad PGND acts, the occurrence of problems such as the short circuit of wiring, or damage to the lead-out wiring 5 or the like can be prevented. Since the reference voltage generation circuit 62 can be disposed by effectively utilizing a region of the ground pad PGND, the area of the integrated circuit device 20 can be reduced. In FIG. 5, since the ground pad PGND is disposed so as to cover the reference voltage generation circuit 62, a metal layer of the ground pad PGND serves as a shield layer to prevent noise from being transmitted from other circuits of the integrated circuit device 20 and from being superimposed on a reference voltage generated by the reference voltage generation circuit 62. Therefore, the reference voltage generation circuit 62 can generate the reference voltage with low noise, and the performance degradation of the integrated circuit device 20 caused by the noise superimposed on the reference voltage can be prevented.

Figure 6:
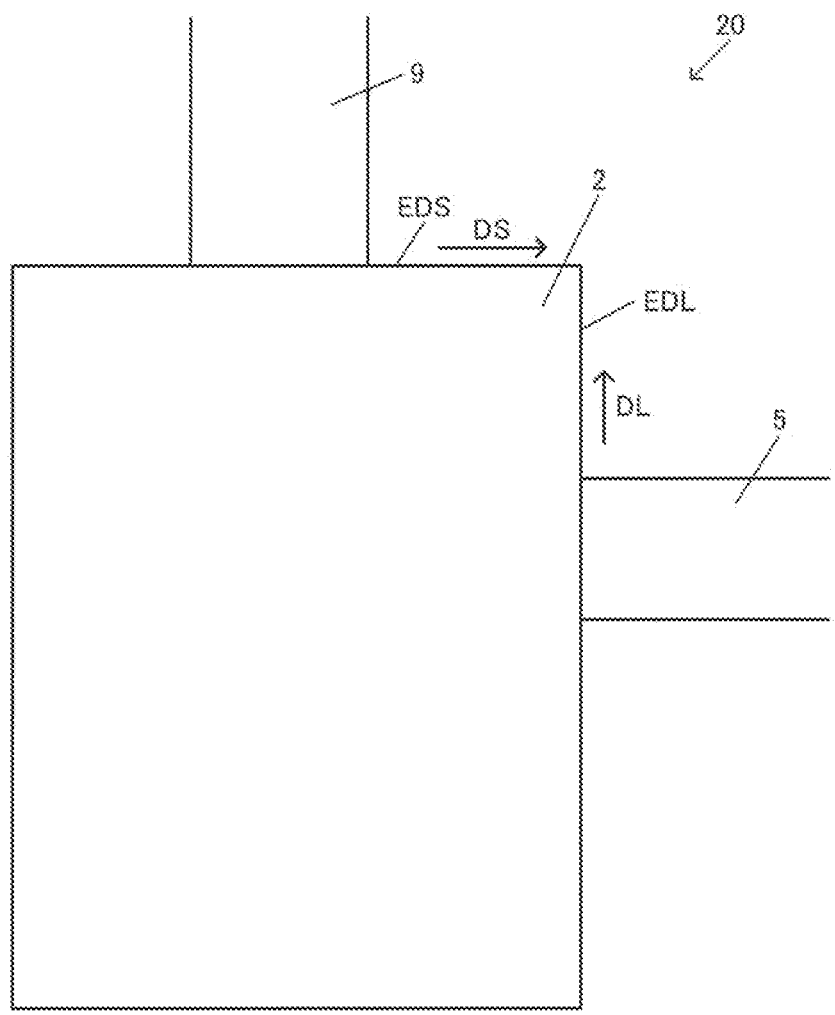
FIG. 6 is a layout arrangement example when a plurality of lead-out wirings are wired from a pad.

In FIG. 6, the integrated circuit device 20 includes a second lead-out wiring 9 led out from the outer edge EDS on the lateral side of the pad 2 along the longitudinal direction DL of the pad 2, in addition to the lead-out wiring 5 led out from the outer edge EDL on the longitudinal side of the pad 2 along the lateral direction DS of the pad 2. The second lead-out wiring 9 is formed of the metal layer ALE in the same layer as the pad 2. For example, in a power supply pad to which the power supply voltage is supplied, the power supply voltage supplied to the power supply pad may be supplied to each circuit of the integrated circuit device 20 by a plurality of lead-out wirings. In such a power supply pad or the like, as shown in FIG. 6, the second lead-out wiring 9 led out from the outer edge EDS on the lateral side of the pad 2 may be provided. This is because, in this case, the lead-out wiring 5 and the second lead-out wiring 9 supply the power supply voltage or the like of the same potential to each circuit of the integrated circuit device 20, so that it is considered that there is little risk of problems even when a force or the like along a longitudinal direction of a pad acts.

Figure 7:
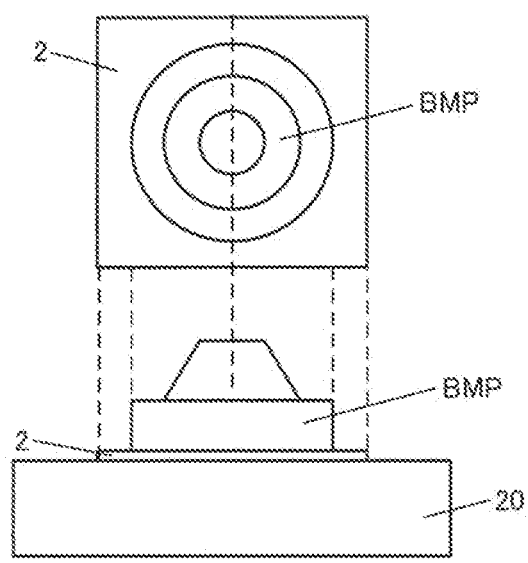
FIG. 7 is a diagram showing a bump formed on the pad.
Figure 14:
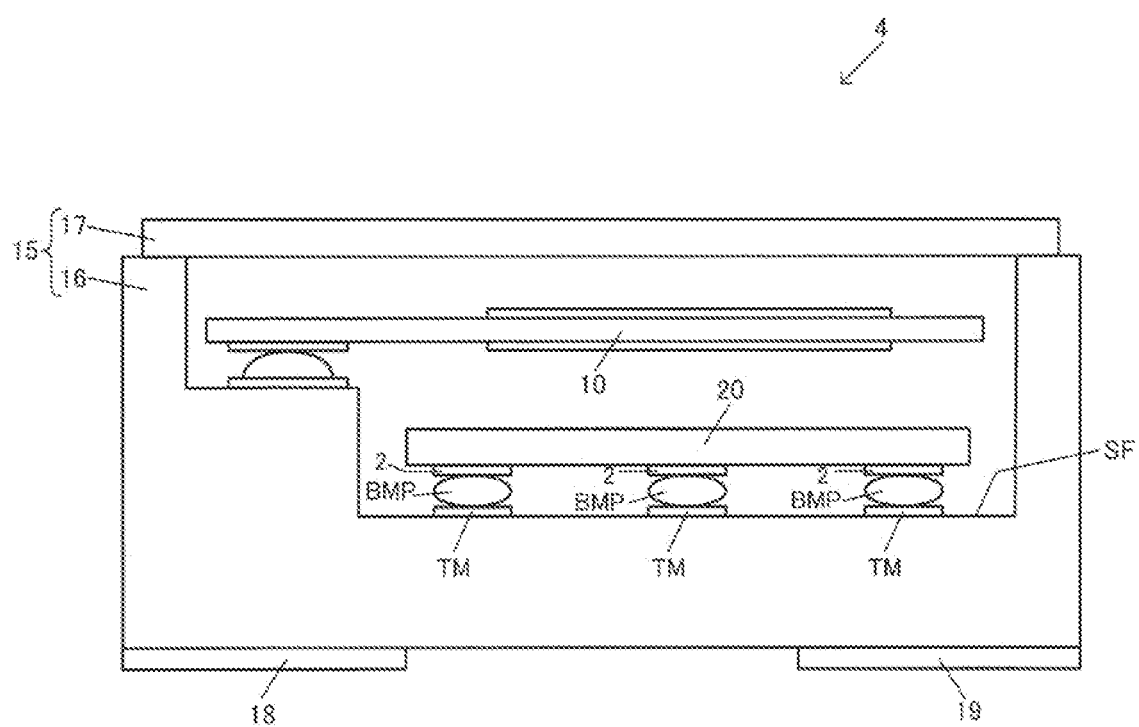
FIG. 14 is a structure example of an oscillator, which is a device according to the present embodiment.

Next, a problem caused by the ultrasonic bonding during the mounting of the integrated circuit device 20 will be described. In FIG. 7, a bump BMP is formed on the pad 2 of the integrated circuit device 20. The bump BMP is called, for example, a stud bump, and is used, for example, in a flip-chip mounting of the integrated circuit device 20. In the stud bump, a ball is formed at a tip of a wire such as a gold wire, and the ball is pressure-bonded to an upper surface of the pad 2 using heat, ultrasonic vibration, or the like, and then the wire is cut. Accordingly, as shown in FIG. 7, the bump BMP such as a gold bump can be formed in a vicinity of a center of the pad 2. Thus, the integrated circuit device 20 in which the bump BMP is formed on the pad 2 is flip-chip mounted on a surface SF, which is a mounting surface of a package 15, as shown in FIG. 14 described later. Specifically, the integrated circuit device 20 is disposed such that the other end of the bump BMP comes into contact with a terminal TM formed on the surface SF of the package 15, and the terminal TM formed of gold or the like and the other end of the bump BMP are bonded by ultrasonic vibration.

Figure 8:
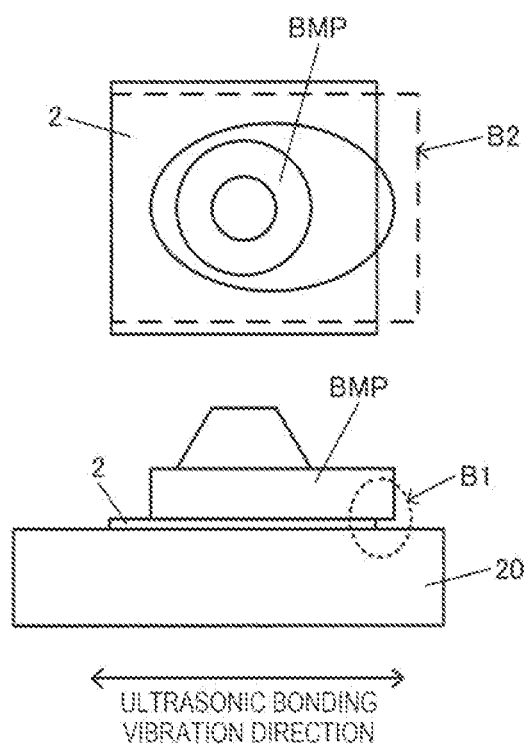
FIG. 8 is a diagram showing problems in ultrasonic bonding.

However, when the ultrasonic bonding using such ultrasonic vibration is performed, a situation may occur in which the bump BMP formed on the pad 2 expands in the vibration direction of the ultrasonic wave as shown in FIG. 8, and protrudes from the region of the pad 2. When such a situation occurs, in an arrow B1 of FIG. 8, the protruding bump BMP comes into contact with the passivation film 3 of FIG. 1, and a crack is generated. In the pad 2 made of a metal softer than the passivation film 3, there is no problem even if a force due to ultrasonic vibration is applied, but when the force due to ultrasonic vibration is applied to the hard passivation film 3, a crack is generated. When the metal of the pad 2 passes through the crack and comes into contact with another wiring, problems such as the short circuit occurs. In order to prevent the occurrence of such a problem, in the present embodiment, as shown in an arrow B2 of FIG. 8, the pad 2 is formed in a shape in which a direction of the ultrasonic vibration is the longitudinal direction thereof. Specifically, the pad 2 has, for example, a rectangular shape in which the direction of the ultrasonic vibration is a long side direction thereof. In this way, even when a shape of the bump BMP in the plan view becomes an elliptical shape due to the ultrasonic vibration, it is possible to prevent the bump BMP from protruding from the pad 2, and to prevent the occurrence of problems such as a short circuit of the wiring due to the generation of the crack as described above.

On the other hand, in a method of disposing the circuit 8 so as to overlap the pad 2, the lead-out wiring 5 or the via group 6 for electrically coupling the pad 2 and the circuit 8 are required. However, when the lead-out wiring 5 from the pad 2 is led out from the outer edge EDS on the lateral side of the pad 2, stress is applied to the lead-out wiring 5 and the via group 6 due to ultrasonic vibration, and problems such as the short circuit or the wire-breakage may occur. Therefore, in the present embodiment, a method is adopted in which the pad 2 is formed in the shape having the longitudinal direction and the lateral direction, the lead-out wiring 5 is led out from the outer edge EDL on the longitudinal side of the pad 2, and the lead-out wiring 5 and the wiring 7 of the circuit 8 are electrically coupled by the via group 6. In this way, even when the longitudinal direction of the pad 2 is the vibration direction of the ultrasonic vibration, it is possible to prevent the stress from being applied to the lead-out wiring 5 and the via group 6 due to stress of the ultrasonic vibration, and to prevent the occurrence of problems such as the short circuit or the wire-breakage.

As described above, in FIGS. 7 and 8, the pad 2 is a pad electrically coupled to an external terminal by the bump BMP. The bump BMP is ultrasonically bonded to the terminal. The longitudinal direction DL of the pad 2 is the direction of ultrasonic vibration of the ultrasonic bonding. In other words, the longitudinal direction DL of the pad 2 is the longitudinal direction of the bump BMP. In this way, as shown in FIG. 8, the occurrence of problems such as the short circuit due to the bump BMP protruding from the region of the pad 2 can be prevented. Since the lead-out wiring 5 is led out from the outer edge EDL on the longitudinal side of the pad 2, stress caused by the ultrasonic vibration of the ultrasonic bonding can be prevented from being applied to the lead-out wiring 5 and the via group 6, and the occurrence of problems such as the short circuit or the wire-breakage can be prevented.

In the above description, a case where problems such as the short circuit due to the ultrasonic vibration in the stud bump occurs has been described, but the present embodiment is not limited thereto. For example, ultrasonic vibration may be used also in wire bonding, and also in this case, a method of setting the longitudinal direction DL of the pad 2 to the direction of ultrasonic vibration and leading out the lead-out wiring 5 from the outer edge EDL on the longitudinal side of the pad 2 is effective. The bump BMP may be a bump other than the stud bump, and even when stress is applied along a predetermined direction in some method other than the ultrasonic bonding, a method of setting the longitudinal direction of the pad 2 to the predetermined direction and leading out the lead-out wiring 5 from the outer edge EDL on the longitudinal side of the pad 2 is effective. A phenomenon in which the bump BMP protrudes from the region of the pad 2 can also occur by forming the bump BMP on the pad 2 by the ultrasonic bonding.

Figure 9:
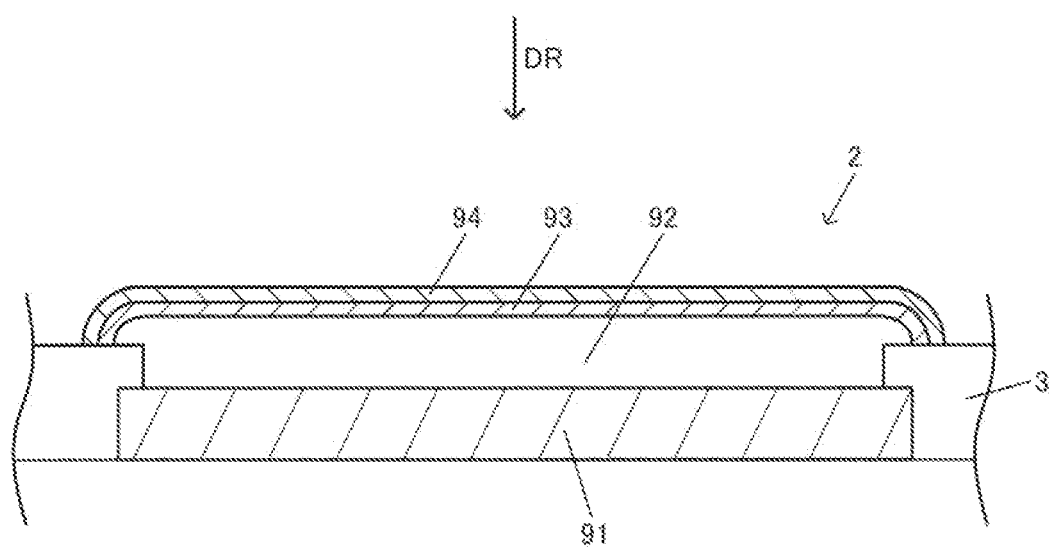
FIG. 9 is a diagram showing a structure example of the pad.

A structure of the pad 2 is not limited to a structure shown in FIG. 1, and various structures can be adopted. FIG. 9 is a cross-sectional view showing another structure example of the pad 2. In FIG. 9, conductive layers 92, 93, and 94 are formed on a pad metal 91 by, for example, plating. The conductive layer 92 is formed of a material having good bondability with the pad metal 91 formed of aluminum or an aluminum alloy, and is formed of, for example, nickel or a nickel alloy. The conductive layer 92 has a thickness of, for example, 2 μm to 10 μm. By increasing the thickness of the conductive layer 92 in this way, even when a large load is applied when a bump or a bonding wire is bonded to the pad 2, this load is less likely to be transmitted to a lower side of the pad 2. Therefore, it is possible to prevent a situation in which a problem occurs in the circuit 8 provided below the pad 2 due to the load when the bump or the bonding wire is bonded. The conductive layer 93 is interposed between the conductive layer 92 and the conductive layer 94 to enhance adhesion between the conductive layers 92 and 94, and function as a barrier layer for preventing the conductive layer 92 from diffusing into the conductive layer 94. The conductive layer 93 is formed of a material having good adhesion to both the conductive layer 92 and the conductive layer 94, and is formed of, for example, palladium or a palladium alloy. The conductive layer 93 may be provided as necessary, and may be omitted, for example, when the adhesion between the conductive layer 92 and the conductive layer 94 is good. The conductive layer 94 functions as a coupling layer with the bump or the bonding wire. The conductive layer 94 is formed of a material having a low contact resistance with the bump or the bonding wire, and is formed of, for example, gold or an alloy of gold. By using the pad 2 having the structure as shown in FIG. 9, the circuit 8 under the pad can be protected against a load during mounting to bond the bump or the bonding wire on the pad 2, and the bump or the bonding wire can be bonded at the low contact resistance, thereby facilitating mounting and improving reliability.

2. Integrated Circuit Device

Figure 10:
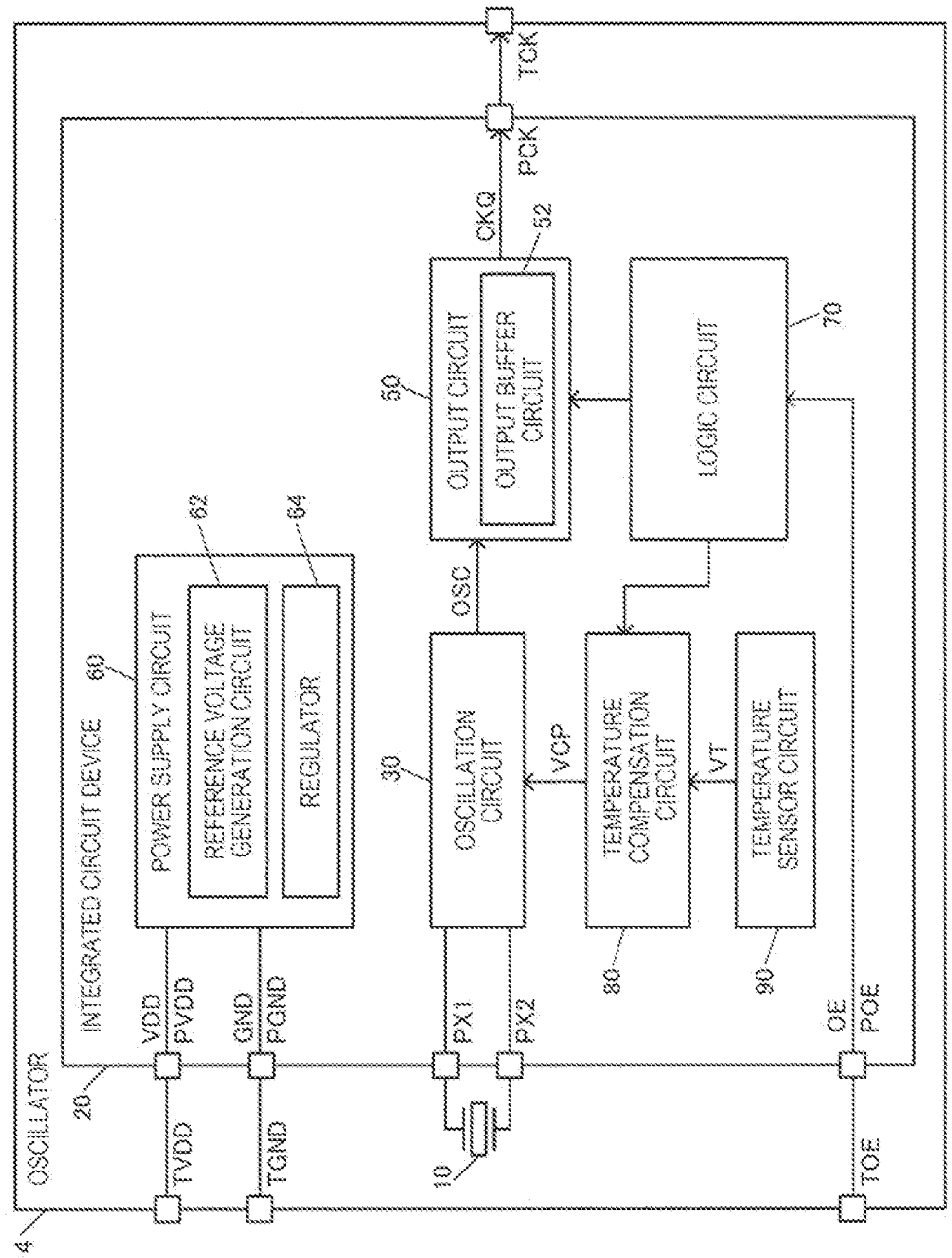
FIG. 10 is a configuration example of the integrated circuit device according to the present embodiment.

Next, a specific example of the integrated circuit device 20 according to the present embodiment will be described. FIG. 10 is a diagram showing a configuration example of the integrated circuit device 20 according to the present embodiment. The integrated circuit device 20 is not limited to the configuration in FIG. 10, and it is possible to carry out various modifications such as omitting a part of constituent elements thereof, and adding other constituent elements. Hereinafter, a case where a device according to the present embodiment in which the integrated circuit device 20 is incorporated is mainly an oscillator 4 will be described as an example, but the device according to the present embodiment is not limited to the oscillator 4.

The integrated circuit device 20 shown in FIG. 10 includes an oscillation circuit 30. The integrated circuit device 20 may include an output circuit 50, a power supply circuit 60, a logic circuit 70, a temperature compensation circuit 80, a temperature sensor circuit 90, a power supply pad PVDD, the ground pad PGND, a clock pad PCK, an output enable pad POE, and pads PX1 and PX2 for coupling a resonator. The oscillator 4, which is an example of the device according to the present embodiment, includes a resonator 10 and the integrated circuit device 20. The resonator 10 is electrically coupled to the integrated circuit device 20. For example, the resonator 10 and the integrated circuit device 20 are electrically coupled to each other by using an internal wiring of a package that houses the resonator 10 and the integrated circuit device 20, the bonding wire, a metal bump, or the like.

The resonator 10 is an element that generates mechanical oscillation by an electric signal. The resonator 10 can be implemented by a resonator element such as a crystal resonator element. For example, the resonator 10 can be implemented by a crystal resonator element performing thickness-shear vibration such as those having a cut angle of AT cut, SC cut, or the like, a tuning fork type crystal resonator element, a double-tuning fork type crystal resonator element, or the like. For example, the resonator 10 may be a resonator built in a temperature compensated crystal oscillator (TCXO) not including a thermostatic bath, or may be a resonator built in a thermostatic bath crystal oscillator (OCXO) including a thermostatic bath. Alternatively, the resonator 10 may be a resonator built in an oscillator of a simple packaged crystal oscillator (SPXO) The resonator 10 according to the present embodiment can be implemented by various resonator elements such as a resonator element other than a thickness-shear resonator element, a tuning fork type resonator element, or a double-tuning fork type resonator element, or a piezoelectric resonator element formed of a material other than quartz crystal. For example, as the resonator 10, a surface acoustic wave (SAW) resonator, a micro electro mechanical systems (MEMS) resonator as a silicon resonator formed using a silicon substrate, or the like may be adopted.

The integrated circuit device 20 is, for example, an integrated circuit (IC) manufactured by a semiconductor process, and is a semiconductor chip in which the circuit elements are formed at a semiconductor substrate.

The oscillation circuit 30 is a circuit that oscillates the resonator 10. For example, the oscillation circuit 30 is electrically coupled to the pads PX1 and PX2, and generates an oscillation signal OSC by oscillating the resonator 10. The pad PX1 is a first resonator coupling pad, and the pad PX2 is a second resonator coupling pad. For example, the oscillation circuit 30 can be implemented by a drive circuit for oscillation provided between the pad PX1 and the pad PX2 and a passive element such as a capacitor or a resistor. The drive circuit can be implemented by, for example, a CMOS inverter circuit or a bipolar transistor. The drive circuit is a core circuit of the oscillation circuit 30, and the drive circuit oscillates the resonator 10 by driving the oscillator 10 with a voltage or a current. As the oscillation circuit 30, various types of oscillation circuits such as an inverter type, a Pierce type, a Colpitts type, or a Hartley type can be used. The oscillation circuit 30 is provided with a variable capacitance circuit, and an oscillation frequency can be adjusted by adjusting a capacitance of the variable capacitance circuit. The variable capacitance circuit can be implemented by a variable capacitance element such as a varactor. For example, the variable capacitance circuit can be implemented by the variable capacitance element whose capacitance is controlled based on a temperature compensation voltage. Alternatively, the variable capacitance circuit may be implemented by a capacitor array and a switch array coupled to the capacitor array. The coupling in the present embodiment is an electrical coupling. The electrical coupling refers to a coupling in which electric signals can be transmitted, and refers to a coupling in which information can be transmitted by the electric signals. The electrical coupling may be a coupling via a passive element or the like.

The output circuit 50 outputs a clock signal CKQ based on the oscillation signal OSC. The output circuit 50 includes the output buffer circuit 52. The output buffer circuit 52 outputs a signal buffered by the oscillation signal OSC to the clock pad PCK as the clock signal CKQ. This clock signal CKQ is output to the outside via an external terminal TCK of the oscillator 4. For example, the output circuit 50 outputs the clock signal CKQ in a single-ended CMOS signal format. The output circuit 50 may output the clock signal CKQ in a signal format other than the CMOS. For example, the output circuit 50 may output differential clock signals to the outside in a signal format such as a low voltage differential signaling (LVDS), a positive emitter counted logic (PECL), a high speed current steering logic (HCSL), or a differential complementary MOS (CMOS).

The power supply circuit 60 is supplied with a power supply voltage VDD from the power supply pad PVDD and the ground voltage from the ground pad PGND, and supplies various power supply voltages for an internal circuit of the integrated circuit device 20 to the internal circuit. For example, the power supply circuit 60 supplies a regulated power supply voltage based on the power supply voltage VDD to the oscillation circuit 30 and the like. The power supply circuit 60 includes the reference voltage generation circuit 62 and a regulator 64. The reference voltage generation circuit 62 generates and outputs the reference voltage. The reference voltage generation circuit 62 can be implemented by, for example, a bandgap reference circuit, a circuit using a work function difference of a gate, a circuit using a difference in a threshold voltage due to a change in channel impurity concentration, or the like. The regulator 64 is supplied with the power supply voltage VDD and generates various regulated power supply voltages. For example, the regulator 64 generates the regulated power supply voltage of a constant voltage obtained by stepping down the power supply voltage VDD based on the reference voltage generated by the reference voltage generation circuit 62, and supplies the generated regulated power supply voltage to each circuit block of the integrated circuit device 20.

The logic circuit 70 is a control circuit and performs various control processes. For example, the logic circuit 70 controls the entire integrated circuit device 20 or controls an operation sequence of the integrated circuit device 20. For example, the logic circuit 70 controls each circuit block of the integrated circuit device 20 such as the oscillation circuit 30, the output circuit 50, the power supply circuit 60, and the temperature compensation circuit 80. The logic circuit 70 can be implemented by, for example, an application specific integrated circuit (ASIC) using automatic placement and routing such as a gate array.

The temperature compensation circuit 80 performs temperature compensation of the oscillation signal OSC of the oscillation circuit 30. The temperature compensation of the oscillation signal OSC is temperature compensation of the oscillation frequency of the oscillation circuit 30. Specifically, the temperature compensation circuit 80 performs the temperature compensation based on temperature detection information from the temperature sensor circuit 90. For example, the temperature compensation circuit 80 performs the temperature compensation of the oscillation signal OSC of the oscillation circuit 30 by generating a temperature compensation voltage VCP based on a temperature detection voltage VT from the temperature sensor circuit 90, and outputting the generated temperature compensation voltage VCP to the oscillation circuit 30. For example, the temperature compensation circuit 80 performs the temperature compensation by outputting the temperature compensation voltage VCP serving as a capacitance control voltage of the variable capacitance circuit to the variable capacitance circuit included in the oscillation circuit 30. In this case, the variable capacitance circuit of the oscillation circuit 30 is implemented by the variable capacitance element such as the varactor. The temperature compensation is a process of reducing and compensating a variation of the oscillation frequency due to a temperature variation. For example, the temperature compensation circuit 80 performs analog temperature compensation by polynomial approximation. For example, when the temperature compensation voltage for compensating frequency-temperature characteristics of the resonator 10 is approximated by a polynomial, the temperature compensation circuit 80 performs analog temperature compensation based on coefficient information of the polynomial. The temperature compensation circuit 80 may perform digital temperature compensation.

The temperature sensor circuit 90 is a sensor circuit that detects a temperature. Specifically, the temperature sensor circuit 90 outputs, as the temperature detection voltage VT, a temperature dependent voltage that changes in accordance with an environmental temperature. For example, the temperature sensor circuit 90 generates the temperature detection voltage VT using the circuit elements having temperature dependency. Specifically, the temperature sensor circuit 90 outputs the temperature detection voltage VT whose voltage value changes depending on the temperature by using the temperature dependence of a forward voltage of a PN junction. As the forward voltage of the PN junction, for example, a base-emitter voltage of a bipolar transistor can be used. When a digital temperature compensation process is performed, the temperature sensor circuit 90 measures a temperature such as the environmental temperature, and outputs a result of the measurement as temperature detection data.

The integrated circuit device 20 includes the power supply pad PVDD, the ground pad PGND, the clock pad PCK, the output enable pad POE, and the pads PX1 and PX2 for coupling a resonator. These pads are terminals of the integrated circuit device 20 serving as, for example, the semiconductor chip.

The power supply pad PVDD is a pad to which the power supply voltage VDD is supplied. For example, the power supply voltage VDD from an external power supply device is supplied to the power supply pad PVDD. The ground pad PGND is a terminal to which GND, which is the ground voltage, is supplied. GND may be referred to as VSS, and the ground voltage is, for example, a ground potential. In the present embodiment, the ground is appropriately described as GND. The clock pad PCK is a pad from which the clock signal CKQ is output. For example, the clock signal CKQ based on the oscillation signal OSC in the oscillation circuit 30 is output from the clock pad PCK to the outside. The output enable pad POE is a pad that controls the output enable of the clock signal CKQ. Specifically, the output enable of the clock signal CKQ is controlled based on the output enable signal OE input via the output enable pad POE. For example, the logic circuit 70 receives the output enable signal OE from the output enable pad POE, and controls the output enable of the clock signal CKQ in the output circuit 50.

The power supply pad PVDD, the ground pad PGND, the clock pad PCK, and the output enable pad POE are electrically coupled to external terminals TVDD, TGND, TCK, and TOE for externally coupling the oscillator 4, respectively. For example, the power supply pad PVDD, the ground pad PGND, the clock pad PCK, and the output enable pad POE are electrically coupled using the internal wiring of the package, the bonding wire, the metal bump, or the like. The external terminals TVDD, TGND, TCK, and TOE of the oscillator 4 are electrically coupled to an external device. The pads PX1 and PX2 are pads for coupling the resonator 10. For example, the pad PX1 is electrically coupled to one end of the resonator 10, and the pad PX2 is electrically coupled to the other end of the resonator 10. For example, the resonator 10 and the pads PX1 and PX2 of the integrated circuit device 20 are electrically coupled by using the internal wiring of the package that houses the resonator 10 and the integrated circuit device 20, the bonding wire, the metal bump, or the like.

Figure 11:
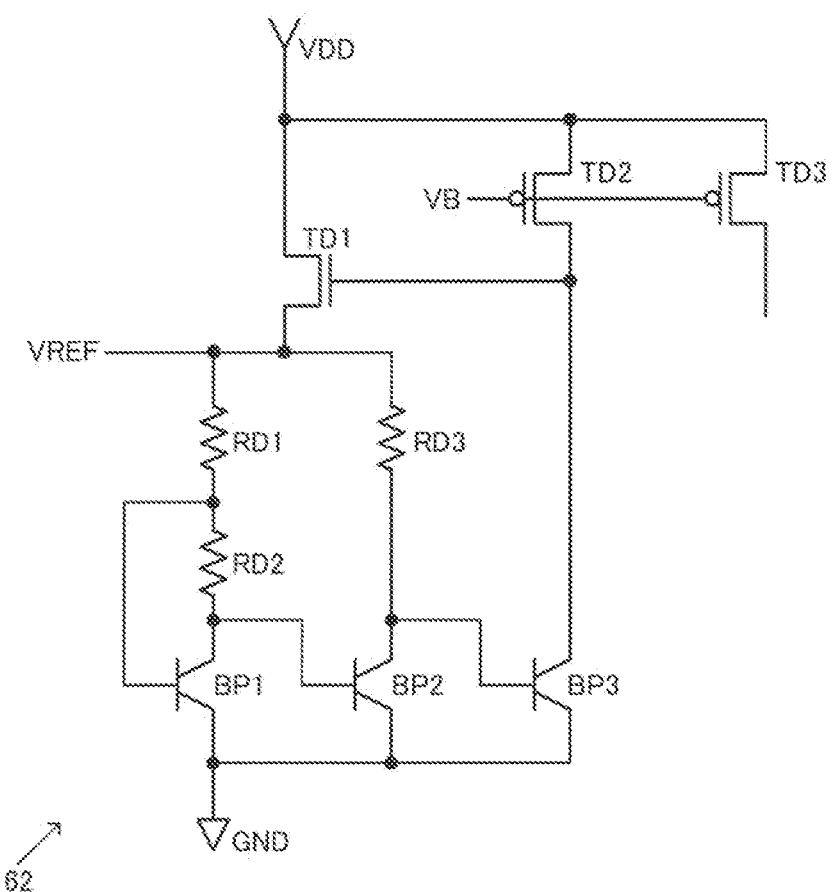
FIG. 11 is a configuration example of a reference voltage generation circuit.

FIG. 11 is a configuration example of the reference voltage generation circuit 62. The reference voltage generation circuit 62 of FIG. 11 includes an N-type transistor TD1, resistors RD1, RD2, and RD3, and bipolar transistors BP1 and BP2, which are provided between a VDD node and a GND node. The reference voltage generation circuit 62 includes P-type transistors TD2 and TD3 having gates to which a bias voltage VB is input, and a bipolar transistor BP3 provided between a drain node of the transistor TD2 and a GND node. The reference voltage generation circuit 62 is the bandgap reference circuit, and generates and outputs a reference voltage VREF based on a bandgap voltage. For example, the base-emitter voltages of PNP-type bipolar transistors BP1 and BP2 are VBE1 and VBE2, and ΔVBE=VBE1−VBE2. The reference voltage generation circuit 62 outputs a reference voltage VREF that satisfies VREF=K×ΔVBE+VBE2, for example. K is set by resistance values of the resistors RD1 and RD2. For example, since VBE2 has a negative temperature characteristic and ΔVBE has a positive temperature characteristic, the reference voltage VREF of a constant voltage without temperature dependency can be generated by adjusting the resistance values of the resistors RD1 and RD2. The generated reference voltage VREF is a constant voltage based on the ground voltage.

Figure 12:
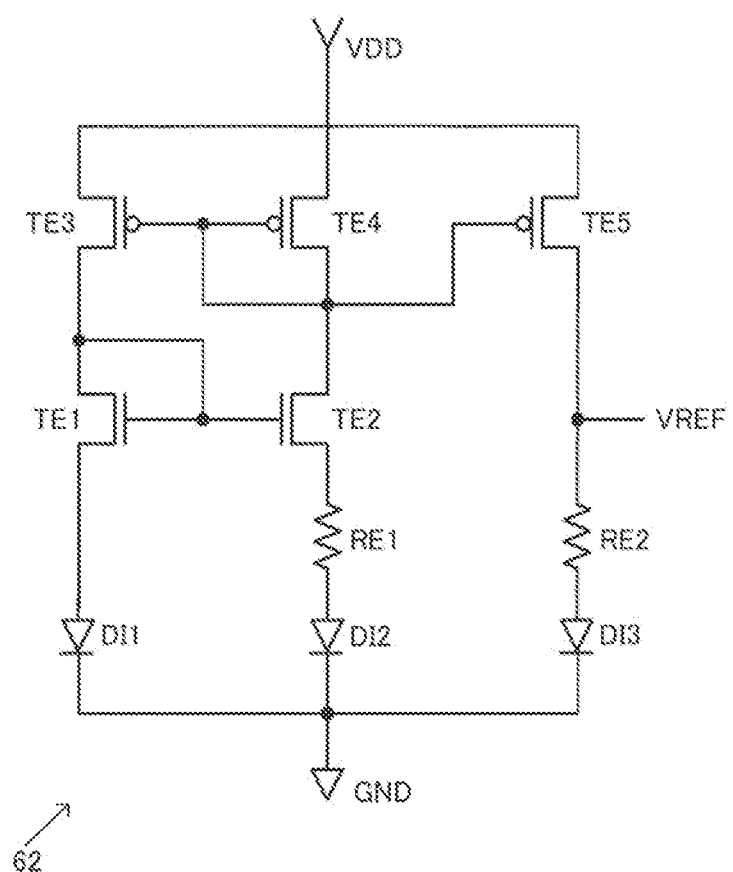
FIG. 12 is another configuration example of the reference voltage generation circuit.

FIG. 12 shows another configuration example of the reference voltage generation circuit 62. The reference voltage generation circuit 62 in FIG. 12 is also the bandgap reference circuit, and includes N-type transistors TE1 and TE2, P-type transistors TE3, TE4, and TE5, resistors RE1 and RE2, and diodes DI1, DI2, and DI3 having PN junctions. Since the N-type transistors TE1 and TE2 form a current mirror circuit, and the P-type transistors TE3, TE4, and TE5 also form the current mirror circuit, the currents flowing through these transistors are almost equal. The voltages of sources of N-type transistors TE1 and TE2 are also almost equal. The number of parallel couplings of the PN junction in the diode DI2 is formed to be M times the number of parallel couplings of the PN junction in the diode DI1. Therefore, when a saturation current of the diode DI1 is Is, a saturation current of the diode DI2 is M×Is. Here, when a current flowing through the transistors TE3, TE4, and TE5 is I, voltages across the diodes DI1, DI2, and DI3 are Vd1, Vd2, and Vd3, and resistance values of the resistors RE1 and RE2 are R1 and R2, the reference voltage VREF generated by the reference voltage generation circuit 62 is expressed by the following equation (1).

$$\begin{aligned} VREF &= I \times R2 + Vd3 \\ &= (R2/R1) \times (kT/q) \times \ln(M) + Vd3 \end{aligned} \quad (1)$$

Here, k is a Boltzmann constant, T is an absolute temperature, and q is a charge of an electron. When the above equation (1) is differentiated by the absolute temperature T, the following equation (2) is obtained.

$$dVREF/dT = (R2/R1) \times (k/q) \times \ln(M) + Vd3/dT \quad (2)$$

In the above equation (2), the term of Vd3/dT has a negative temperature characteristic, and in response to this, a value of (R2/R1)×(k/q)×ln(M) is adjusted to be a positive value so that a value of the above equation (2) can be set to zero, and the reference voltage VREF in which the temperature dependency is cancelled can be generated. The reference voltage generation circuit 62 is not limited to the configurations shown in FIGS. 11 and 12, and can use circuits having various configurations such as a circuit that generates the reference voltage VREF using a work function difference voltage between transistors.

In the above, the device according to the present embodiment is the oscillator 4, and the configuration example of the integrated circuit device 20 incorporated in the oscillator 4 has been described, but the present embodiment is not limited to this. For example, the device according to the present embodiment may be a sensor device such as a gyro sensor or an acceleration sensor, a display device that displays an image on a display panel, a communication device that performs communication according to a predetermined communication standard, a drive device that drives a predetermined mechanism of a printer, a power supply device that performs supply or control of the power supply, or the like. The integrated circuit device 20 according to the present embodiment is not limited to one incorporated in the oscillator 4, and may be an integrated circuit (IC) incorporated in the above-described sensor device, display device, communication device, power supply device, or the like. For example, when the device is the gyro sensor, the integrated circuit device 20 may include a drive circuit that drives a resonator of the gyro sensor, a detection circuit that detects a sensor signal from the resonator, and the like. When the device is the acceleration sensor, the integrated circuit device 20 may include a drive circuit and a detection circuit of an acceleration sensor element implemented by micro electro mechanical systems (MEMS) or the like. When a sensor is the display device, the integrated circuit device 20 may include a drive circuit of the display panel, a logic circuit for processing display data, and the like. When the sensor is the communication device, the integrated circuit device 20 may include a physical layer circuit, a link layer circuit, and a logic circuit for communication. As described above, circuits having various configurations can be adopted as the integrated circuit device 20.

3. Layout Arrangement

Figure 13:
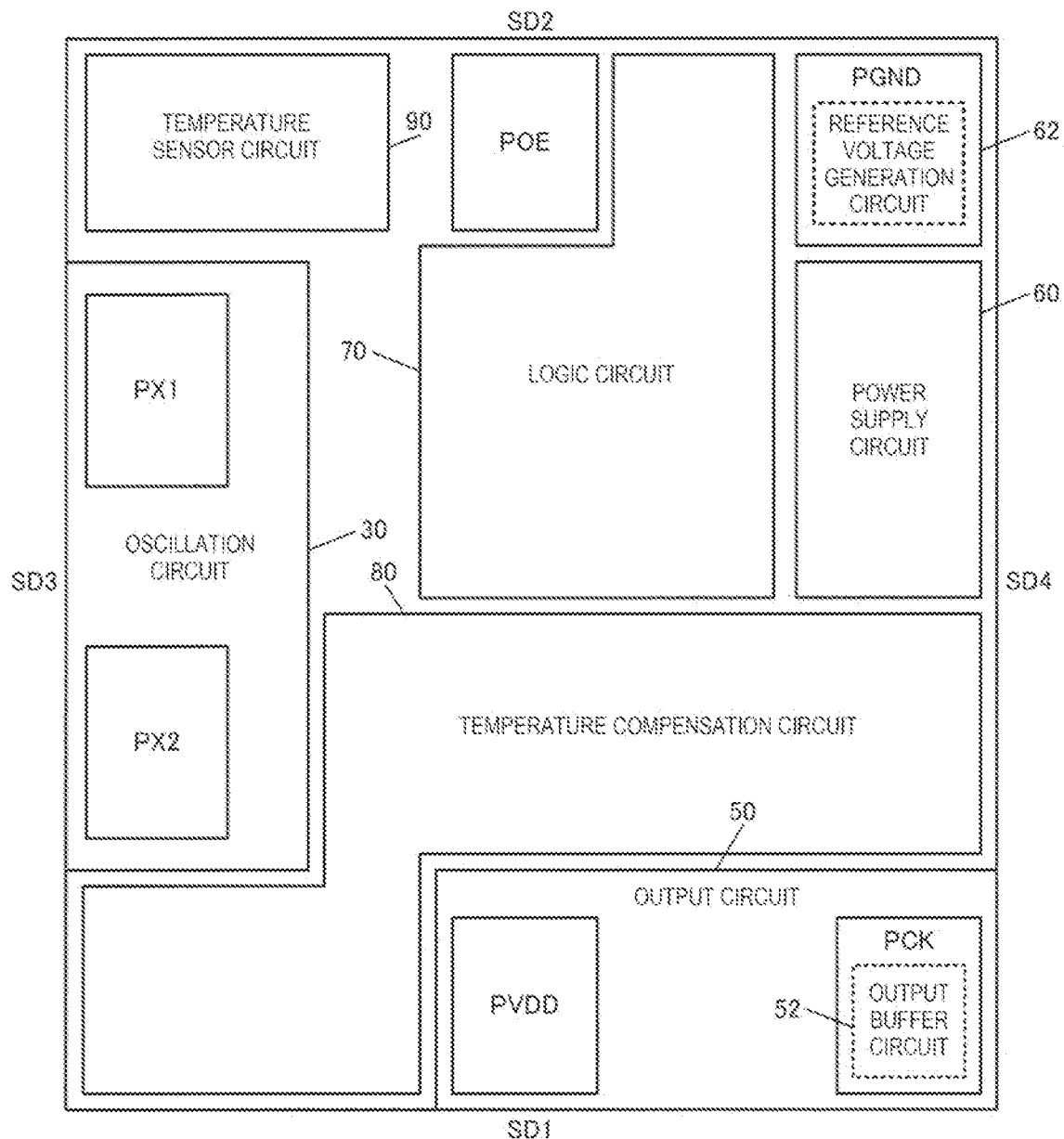
FIG. 13 is a layout arrangement example of the integrated circuit device.

FIG. 13 shows a layout arrangement example of the integrated circuit device 20 shown in FIG. 10. An outer shape of the integrated circuit device 20 includes a side SD1 and a side SD2 facing the side SD1. The side SD1 is a first side, the side SD2 is a second side, and the side SD2 is an opposite side of the side SD1. The outer shape of the integrated circuit device 20 includes a side SD3 and a side SD4 that intersect the side SD1 and the side SD2. The side SD3 is a third side, the side SD4 is a fourth side, and the side SD4 is an opposite side of the side SD3. The outer shape of the integrated circuit device 20 is, for example, an outer shape of a rectangular semiconductor chip that is the integrated circuit device 20. For example, the sides SD1, SD2, SD3, and SD4 are sides of a substrate of the semiconductor chip. The semiconductor chip is also referred to as "silicon die". Here, a direction from the side SD1 to the side SD2 is referred to as a direction DR1, and a direction from the side SD3 to the side SD4 is referred to as a direction DR2. A direction opposite to the direction DR1 is a direction DR3, and a direction opposite to the direction DR2 is a direction DR4. The directions DR1, DR2, DR3, DR4 are a first direction, a second direction, a third direction, and a fourth direction, respectively.

As shown in FIG. 13, the integrated circuit device 20 is provided with the ground pad PGND, the power supply pad PVDD, the clock pad PCK, and the output enable pad POE. The power supply pad PVDD and the clock pad PCK are disposed along the side SD1. The clock pad PCK is disposed, for example, at a first corner portion at which the side SD1 and the side SD4 intersect with each other. The output enable pad POE and the ground pad PGND are disposed along the side SD2. The ground pad PGND is disposed, for example, at a second corner portion at which the side SD2 and the side SD4 intersect with each other. The temperature sensor circuit 90 is disposed, for example, at a third corner portion at which the side SD2 and the side SD3 intersect with each other. The temperature sensor circuit 90 may be disposed so as to overlap the output enable pad POE, for example, in the plan view.

Here, the output enable pad POE corresponds to the input pad PI of FIG. 3, and the clock pad PCK corresponds to the output pad PQ of FIG. 4. The ground pad PGND is the ground pad PGND of FIG. 5. The output enable pad POE, the clock pad PCK, the ground pad PGND, and the power supply pad PVDD disposed in the integrated circuit device 20 are pads having a shape having a longitudinal direction and a lateral direction as described in FIG. 1 and the like, and specifically, are rectangular pads. For example, these pads are pads whose longitudinal direction is the direction DR1 and whose lateral direction is the direction DR2. That is, the integrated circuit device 20 includes a plurality of pads having the direction DR1 as the longitudinal direction and the direction DR2 as the lateral direction. The direction DR1 is, for example, the vibration direction of the ultrasonic wave described in FIG. 8. In other words, the integrated circuit device 20 includes a pad and a second pad as a plurality of pads, and the pad and the second pad each have a shape having a longitudinal direction and a lateral direction. The longitudinal direction of the pad and the longitudinal direction of the second pad are the same direction DR1, and the direction DR1 is the vibration direction of the ultrasonic wave.

The integrated circuit device 20 is provided with the pads PX1 and PX2 for coupling a resonator. The pads PX1 and PX2 for coupling a resonator are disposed along the side SD3. For example, the oscillation circuit 30 is disposed along the side SD3, and the pads PX1 and PX2 for coupling a resonator are disposed in a region of the oscillation circuit 30. The output circuit 50 is disposed along the side SD1 and the power supply circuit 60 is disposed along the side SD4. The logic circuit 70 is disposed between the oscillation circuit 30 and the power supply circuit 60. The temperature compensation circuit 80 is disposed between the oscillation circuit 30 and the output circuit 50, and the logic circuit 70 is disposed between the temperature compensation circuit 80 and the side SD2.

In FIG. 13, the reference voltage generation circuit 62 is disposed so as to overlap the ground pad PGND in the plan view. That is, as described in FIG. 5, the reference voltage generation circuit 62 is disposed below the ground pad PGND. In this way, it is possible to prevent a high-frequency noise from being transmitted to the reference voltage generation circuit 62 due to a shield effect by the ground pad PGND, and to prevent the accuracy of the clock frequency from being lowered due to a potential variation occurring in the reference voltage generated by the reference voltage generation circuit 62. Since the reference voltage generation circuit 62 can be disposed by effectively utilizing an arrangement region of the ground pad PGND, the area of the integrated circuit device 20 can be reduced. In the power supply circuit 60, circuits other than the reference voltage generation circuit 62 are disposed along, for example, the side SD4 without overlapping the ground pad PGND in the plan view.

In FIG. 13, the output buffer circuit 52 is disposed so as to overlap the clock pad PCK in the plan view. That is, as described in FIG. 4, the output buffer circuit 52 is disposed below the clock pad PCK. In the output circuit 50, circuits other than the output buffer circuit 52 are disposed along, for example, the side SD1 without overlapping with the clock pad PCK in the plan view.

By disposing the clock pad PCK and the output buffer circuit 52 so as to overlap each other in the plan view, the clock signal CKQ from the output buffer circuit 52 can be output to the clock pad PCK in a path of a clock wiring of a short path from the output buffer circuit 52 toward the clock pad PCK disposed immediately above the output buffer circuit 52. Accordingly, impedance of the clock wiring can be minimized, and a potential variation caused by the impedance can be reduced. Since the output buffer circuit 52 needs to drive a large external load, the output buffer circuit 52 has a high driving capability. Therefore, when the impedance of the clock wiring is high, the potential variation thereof becomes large and the signal quality of the clock signal CKQ deteriorates. In this regard, when the clock pad PCK and the output buffer circuit 52 are disposed so as to overlap each other in the plan view, the path of the clock wiring coupling the output buffer circuit 52 and the clock pad PCK can be set as a path of the short path, and the impedance of the clock wiring can be prevented to the minimum, thereby preventing the deterioration of the signal quality of the clock signal CKQ. Since the output buffer circuit 52 has a high driving capability to drive the external load, the generated high-frequency noise is large, and the clock pad PCK to which the output buffer circuit 52 and the clock signal CKQ are output becomes a high-frequency noise source. In this regard, when the clock pad PCK and the output buffer circuit 52 are disposed so as to overlap each other in the plan view, such a high-frequency noise source can be collectively disposed in one location. Accordingly, measures such as a layout arrangement for reducing adverse effects of noise from the high-frequency noise source can be easily realized.

As shown in FIG. 13, the external shape of the integrated circuit device 20 includes the side SD1 and the side SD2 facing the side SD1, the output buffer circuit 52 and the clock pad PCK are disposed at the side SD1 side, and the reference voltage generation circuit 62 and the ground pad PGND are disposed at the side SD2 side. The side SD1 is the first side, and the side SD2 is the second side. For example, the output buffer circuit 52 and the clock pad PCK are disposed at locations closer to the side SD1 than to the side SD2. The reference voltage generation circuit 62 and the ground pad PGND are disposed at locations closer to the side SD2 than to the side SD1. For example, the output buffer circuit 52 and the clock pad PCK are disposed in a first region between the side SD1 and a center line of the side SD1 and the side SD2, and the reference voltage generation circuit 62 and the ground pad PGND are disposed in a second region between the side SD2 and the center line of the side SD1 and the side SD2. In this way, the output buffer circuit 52 and the clock pad PCK that serve as high-frequency noise sources are disposed at the side SD1 side, while the reference voltage generation circuit 62 and the ground pad PGND that need to avoid the high-frequency noise are disposed at the side SD2 side. Accordingly, a distance between the output buffer circuit 52 and the clock pad PCK, which are high-frequency noise sources, and the reference voltage generation circuit 62 and the ground pad PGND can be increased. Therefore, it is possible to prevent the high-frequency noise from the output buffer circuit 52 and the clock pad PCK from being transmitted to the reference voltage generation circuit 62 and the ground pad PGND, and it is possible to prevent degradation of the accuracy of the clock frequency caused by the high-frequency noise.

The external shape of the integrated circuit device 20 includes the side SD3 that is a third side intersecting the side SD1 and side SD2, and the oscillation circuit 30 is provided on the side SD3 side. For example, the oscillation circuit 30 is provided along the side SD3. Specifically, the oscillation circuit 30 is disposed such that, for example, a long side of the oscillation circuit 30 is along the side SD3. In this way, since the oscillation circuit 30 is disposed at the side SD3 side, a distance between the output buffer circuit 52 and the like disposed at the side SD1 side and the oscillation circuit 30 can be increased, and the high-frequency noise of the output buffer circuit 52 is superimposed on the oscillation signal OSC, and the oscillation characteristic can be prevented from being deteriorated. Since the oscillation circuit 30 is disposed at the side SD3 side, a distance between the reference voltage generation circuit 62 and the like disposed at the side SD2 side and the oscillation circuit 30 can be increased, and the oscillation noise from the oscillation circuit 30 is superimposed on the reference voltage or the like of the reference voltage generation circuit 62, and the accuracy of the clock frequency can be prevented from being lowered.

The integrated circuit device 20 includes the temperature compensation circuit 80 that performs temperature compensation of the oscillation frequency of the oscillation signal OSC. As shown in FIG. 13, the temperature compensation circuit 80 is provided between the oscillation circuit 30 and the clock pad PCK. For example, the temperature compensation circuit 80 is provided on the direction DR2 side of the oscillation circuit 30, and the clock pad PCK is provided on the direction DR2 side of the temperature compensation circuit 80. In this way, since the temperature compensation circuit 80 are disposed between the oscillation circuit 30 and the clock pad PCK, the temperature compensation circuit 80 can be disposed by effectively utilizing a region between the oscillation circuit 30 and the clock pad PCK, and efficient layout arrangement can be achieved. A distance between the clock pad PCK, which is a noise source, and the oscillation circuit 30 can be increased, and the noise from the clock pad PCK can be prevented from being transmitted to the oscillation circuit 30. The temperature compensation circuit 80 can be disposed in a vicinity of the oscillation circuit 30, and the temperature compensation voltage VCP from the temperature compensation circuit 80 can be input to the oscillation circuit 30 via the signal path of the short path, thereby realizing the temperature compensation of the oscillation frequency.

4. Oscillator

FIG. 14 shows a structure example of the oscillator 4, which is an example of the device according to the present embodiment. The oscillator 4 includes the resonator 10, the integrated circuit device 20, and the package 15 that houses the resonator 10 and the integrated circuit device 20. The package 15 is made of, for example, ceramic or the like, and has a housing space inside the package 15. The resonator 10 and the integrated circuit device 20 are housed in the housing space. The housing space is hermetically sealed and is preferably in a decompressed state, which is close to vacuum. The package 15 can suitably protect the resonator 10 and the integrated circuit device 20 from an impact, dust, heat, moisture, or the like.

The package 15 includes a base 16 and a lid 17. Specifically, the package 15 includes the base 16 that supports the resonator 10 and the integrated circuit device 20, and the lid 17 that is joined to an upper surface of the base 16 so as to form a housing space between the lid 17 and the base 16. The resonator 10 is supported by a step portion provided inside the base 16 via a terminal electrode. The integrated circuit device 20 is disposed on the surface SF, which is an inner bottom surface of the base 16. Specifically, the integrated circuit device 20 is disposed such that the active surface thereof faces the inner bottom surface of the base 16. The active surface is a surface on which the circuit elements of the integrated circuit device 20 are formed. The bump BMP is formed on the pad 2 that is a terminal of the integrated circuit device 20. The integrated circuit device 20 is supported by the surface SF of the base 16 via the conductive bump BMP. The conductive bump BMP is a metal bump such as the gold bump. One end of the bump BMP is coupled to the pad 2 of the integrated circuit device 20, and the other end of the bump BMP is coupled to the terminal TM provided on the surface SF, which is a mounting surface of the integrated circuit device 20. Accordingly, the pads 2 of the integrated circuit device 20 are electrically coupled to the external terminals 18 and 19 that are external coupling terminals of the oscillator 4, and the resonator 10 via the bump BMP, the terminal TM, and the internal wiring. External terminals 18 and 19 are formed on an outer bottom surface of the package 15. The external terminals 18 and 19 are coupled to the external device via external wirings. The external wiring is, for example, a wiring formed on a circuit substrate on which the external device is mounted. Accordingly, the integrated circuit device 20 can output a clock signal or the like to the external device.

When the integrated circuit device 20 is flip-mounted on the surface SF of the package 15 in FIG. 14, the ultrasonic bonding described in FIG. 8 is used. Specifically, the ultrasonic bonding is used when the other end of the bump BMP whose one end is coupled to the pad 2 of the integrated circuit device 20 is coupled to the terminal TM on the surface SF of the package 15. In this case, in the present embodiment, the pad 2 in which the direction of ultrasonic vibration in the ultrasonic bonding is the longitudinal direction DL is disposed in the integrated circuit device 20. Accordingly, the occurrence of problems such as the short circuit of the wiring due to the ultrasonic vibration can be prevented. The lead-out wiring 5 is led out from the outer edge EDL on the longitudinal side of the pad 2 along the lateral direction DS of the pad 2, and the lead-out wiring 5 is electrically coupled to the wiring 7 of the circuit 8 below the pad 2 via the via group 6. Accordingly, it is possible to prevent stress caused by the ultrasonic vibration or the like from being applied to the lead-out wiring 5 or the via group 6, and to prevent occurrence of problems.

As described above, the device such as the oscillator 4 according to the present embodiment includes the integrated circuit device 20, the package 15 in which the integrated circuit device 20 is housed, the terminal TM provided on the surface SF of the package 15, and the bump BMP for electrically coupling the terminal TM and the pad 2 of the integrated circuit device 20. In this way, the pad 2 of the integrated circuit device 20 and the terminal TM provided on the surface SF of the package 15 can be electrically coupled to each other via the bump BMP, and a signal from the integrated circuit device 20 can be output to the terminal TM, or a signal from the terminal TM can be input to the integrated circuit device 20. Therefore, also in the case where the integrated circuit device 20 is mounted on the surface SF of the package 15, the pad 2 is formed in a shape having a longitudinal direction, and the lead-out wiring 5 of the pad 2 is led out from the outer edge EDL on the longitudinal side, so that the occurrence of various problems described above can be prevented.

For example, as described in FIG. 8, the bump BMP is coupled to the terminal TM by the ultrasonic bonding, and the longitudinal direction of the pad 2 is the direction of the ultrasonic vibration of the ultrasonic bonding. In this way, even when the stress of the ultrasonic vibration in the ultrasonic bonding is applied, the pad 2 is formed in a shape having a longitudinal direction, and the lead-out wiring 5 of the pad 2 is led out from the outer edge EDL on the longitudinal side, so that the occurrence of problems caused by the ultrasonic vibration can be prevented.

The device according to the present embodiment includes the resonator 10 housed in the package 15 as shown in FIG. 14, and as shown in FIG. 10, the integrated circuit device 20 includes the oscillation circuit 30 that generates the oscillation signal OSC by vibrating the resonator 10. Accordingly, as a device according to the present embodiment, the oscillator 4 as described in FIGS. 10 and 14 can be implemented. By forming the pad 2 of the integrated circuit device 20 incorporated in the oscillator 4 into a shape having a longitudinal direction and leading out the lead-out wiring 5 of the pad 2 from the outer edge EDL on the longitudinal side, the oscillator 4 capable of preventing the occurrence of various problems described above can be implemented, and the reliability and the like of the oscillator 4 can be improved.

The device according to the present embodiment is not limited to the oscillator 4 as shown in FIG. 14, and may be a device such as a sensor device, a display device, a communication device, or a power supply device as described above.

Figure 15:
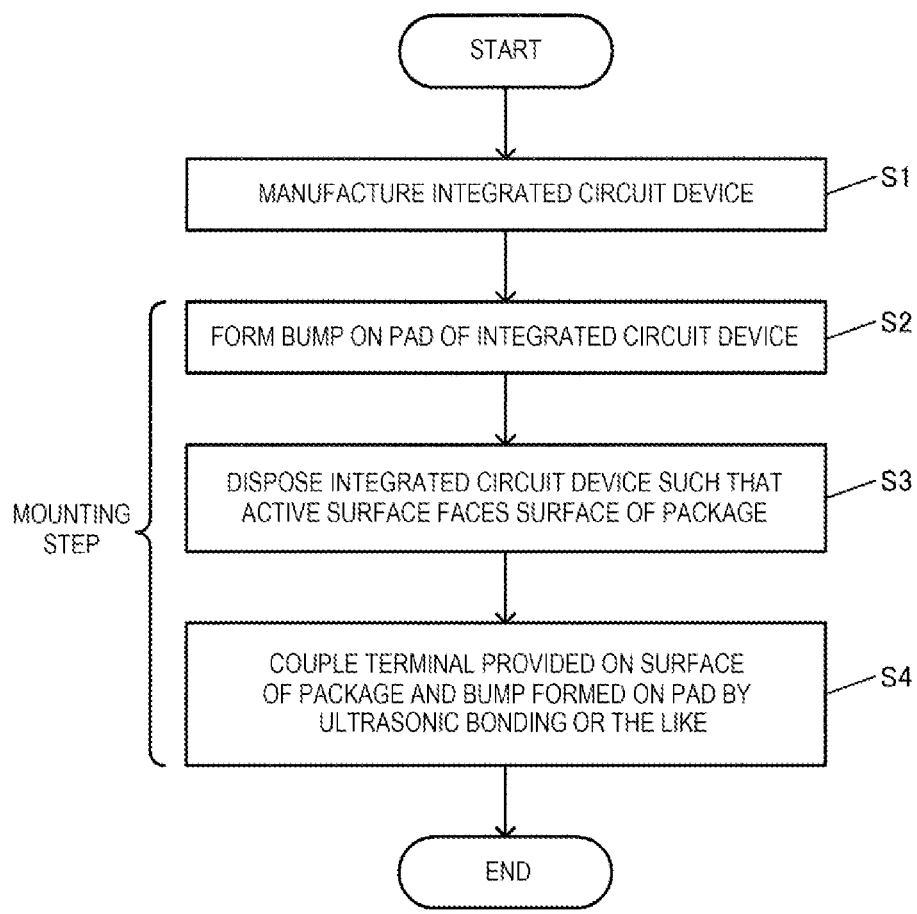
FIG. 15 is a manufacturing process diagram of a manufacturing method according to the present embodiment.

FIG. 15 is a manufacturing process diagram showing an example of a manufacturing method for the device according to the present embodiment. The manufacturing method according to the present embodiment is a method for manufacturing a device including the integrated circuit device 20 and the package 15 in which the integrated circuit device 20 is housed, and includes a manufacturing step S1 of the integrated circuit device 20 and steps S2, S3, and S4 that are mounting steps of the integrated circuit device 20 on the package 15.

In the manufacturing step S1, the pad 2, the circuit 8 electrically coupled to the pad 2, the lead-out wiring 5 of the pad 2, and the via group electrically coupling the lead-out wiring 5 and the wiring 7 of the circuit 8 are formed on the active surface of the integrated circuit device 20. The active surface is a forming region of the circuit elements. As described in FIGS. 1 and 2, the pad 2 is the pad having the shape having the longitudinal direction and the lateral direction, and the circuit 8 overlaps the pad 2 in the plan view and is electrically coupled to the pad 2. The lead-out wiring 5 is led out from the outer edge EDL on the longitudinal side of the pad 2 along the lateral direction DS of the pad 2. The via group 6 electrically couples the lead-out wiring 5 and the wiring 7 of the circuit 8, and is provided at a position where the via group 6 does not overlap the pad 2 in the plan view. The manufacturing step S1 of the integrated circuit device 20 is implemented by the semiconductor process. The semiconductor process includes a film forming step such as a conductive film and an insulating film, a lithography step of performing patterning using a resist or the like, an etching step of removing an unnecessary oxide film or the like, and an ion implantation step of implanting an impurity and activating the impurity by heat treatment, but these steps are well known, and thus a detailed description thereof will be omitted.

In the mounting step after the manufacturing step S1 of the integrated circuit device, the bump BMP is formed on the pad 2 of the integrated circuit device 20 (step S2). For example, the bump BMP called the stud bump is formed. The bump BMP is not limited to the stud bump. Next, as described in FIG. 14, the integrated circuit device 20 is disposed such that the active surface faces the surface SF of the package 15 (step S3). The terminal TM provided on the surface SF of the package 15 and the bump BMP formed on the pad 2 are coupled by ultrasonic bonding in which the longitudinal direction of the pad 2 serves as the vibration direction (step S4). For example, the gold bump BMP and the terminal TM, which is a gold-plated electrode, are rubbed and bonded using the ultrasonic vibration. As a distance between bonding interfaces approaches due to an amplitude of the ultrasonic wave, the metal atoms of each other diffuse, and the metal atoms are bonded by this metal diffusion. Accordingly, the bump BMP and the terminal TM can be bonded at a low temperature.

As described above, according to the manufacturing method of the present embodiment, the pad 2 of the integrated circuit device 20 and the terminal TM provided on the surface of the package 15 can be bonded using the ultrasonic vibration. Therefore, in the present embodiment, the pad 2 of the integrated circuit device 20 is formed in a shape having a longitudinal direction and the lead-out wiring 5 of the pad 2 is led out from the outer edge EDL on the longitudinal side, and thus it is possible to effectively prevent the occurrence of problems caused by stress caused by the ultrasonic vibration.

As described above, the integrated circuit device according to the present embodiment includes: a pad that has a shape having a longitudinal direction and a lateral direction; a circuit that overlaps the pad in a plan view, and is electrically coupled to the pad; a lead-out wiring that is led out from an outer edge on a longitudinal side of the pad along the lateral direction of the pad; and a via group that electrically couples the lead-out wiring and a wiring of the circuit and does not overlap the pad in the plan view.

In the present embodiment, the circuit is disposed so as to overlap with the pad in the plan view. Accordingly, the circuit can be disposed by effectively utilizing the region of the pad, so that the area of the integrated circuit device can be reduced. The pad has the shape having the longitudinal direction and the lateral direction, and the lead-out wiring led out along the lateral direction of the pad from the outer edge on the longitudinal side of the pad and the wiring of the circuit are electrically coupled by the via group, and thus, it is possible to prevent the occurrence of problems or the like caused by the force acting along the longitudinal direction of the pad. Therefore, it is possible to provide an integrated circuit device or the like that is capable of achieving an appropriate lead-out wiring electrically coupling the pad and the circuit while reducing the area of the integrated circuit device by disposing the circuit so as to overlap with the pad.

In the present embodiment, the wiring is a wiring of a metal layer below a metal layer of the pad, and the wiring partially overlaps the pad in the plan view.

In this way, the lead-out wiring from the pad is coupled to one end of the wiring via the via group, and the other end of the wiring is coupled to the circuit elements of the circuit, so that the pad can be electrically coupled to the circuit elements of the circuit disposed so as to overlap the pad.

In the present embodiment, the wiring may be a wiring of the metal layer disposed at the interval of one or more layers than the metal layer of the pad.

In this way, when the load is applied to the pad or the like, it is possible to prevent the occurrence of problems due to damage to the wiring.

In the present embodiment, the lead-out wiring may have a shape whose longitudinal direction is the longitudinal direction of the pad.

In this way, the lead-out wiring having a short length in the horizontal direction is led out from the outer edge on the longitudinal side of the pad, and thus the lead-out wiring can be electrically coupled to the wiring of the circuit via the via group.

In the present embodiment, the plurality of vias of the via group may be provided side by side along the longitudinal direction of the lead-out wiring.

In this way, it is possible to increase the number of the via groups for electrically coupling the lead-out wiring and the wiring of the circuit.

In the present embodiment, the lead-out wiring has a shape in which corner portions are chamfered in the plan view.

In this way, when static electricity or the like is applied to the pad, it is possible to prevent the occurrence of problems due to electric charge being concentrated on the corner portions.

In the present embodiment, the pad is an input pad to which an input signal is input, and the circuit may be an I/O circuit to which an input signal is input from the input pad.

In this way, the input signal to the input pad can be input to the I/O circuit via the lead-out wiring, the via group, and the wiring, the area of the integrated circuit device in which the region of the input pad is effectively utilized can be further reduced.

In the present embodiment, the pad is an output pad that outputs an output signal, and the circuit may be an output buffer circuit that outputs an output signal to the output pad.

In this way, the output signal from the output buffer circuit can be output from the output pad via the wiring, the via group, and the lead-out wiring. It is also possible to prevent performance degradation of the integrated circuit device due to noise from the output buffer circuit.

In the present embodiment, the pad is a ground pad to which ground is supplied, and the circuit may be a reference voltage generation circuit that generates a reference voltage.

In this way, a ground voltage supplied to the ground pad can be supplied to the reference voltage generation circuit via the lead-out wiring, the via group, and the wiring. The ground pad serves as a shield layer to prevent noise from being transmitted from other circuits of the integrated circuit device and from being superimposed on a reference voltage generated by the reference voltage generation circuit.

In the present embodiment, the integrated circuit device includes a second lead-out wiring that is led out from an outer edge on a lateral side of the pad along the longitudinal direction of the pad. The second lead-out wiring may be formed of the metal layer in the same layer as the pad.

As described above, depending on the pad, there may be a pad from which the second lead-out wiring is led out from the outer edge on the lateral side of the pad.

In the present embodiment, the second pad having a shape having a longitudinal direction and a lateral direction is included, and the longitudinal direction of the pad and the longitudinal direction of the second pad may be the same direction.

In this way, when the integrated circuit device is bonded to a package, the vibration of the ultrasonic bonding can be applied along the longitudinal direction of the pad and the second pad, and stress caused by the ultrasonic vibration can be prevented from being applied to the lead-out wiring and the via group.

The present embodiment relates to a device including a package in which the integrated circuit device is housed, a terminal provided on a surface of the package, and a bump for electrically coupling the terminal and the pad of the integrated circuit device.

In this way, the pad of the integrated circuit device and the terminal provided on the surface of the package can be electrically coupled to each other via the bump, and the occurrence of problems due to a force or the like acting along the longitudinal direction of the pad can be prevented.

In the present embodiment, the bump may be ultrasonically bonded to the terminal, and the longitudinal direction of the pad may be the longitudinal direction of the bump.

In this way, the occurrence of problems caused by stress of the ultrasonic vibration in the ultrasonic bonding can be prevented.

In the present embodiment, the device includes a resonator housed in the package, and the integrated circuit device may include an oscillation circuit that generates an oscillation signal by vibrating the resonator.

In this way, a highly reliable oscillator capable of preventing the occurrence of various problems can be implemented.

The present embodiment is a manufacturing method for a device including the integrated circuit device and the package in which the integrated circuit device is housed. The manufacturing method includes a manufacturing step of the integrated circuit device and a mounting step of mounting the integrated circuit device on the package. In the manufacturing step, the pad having the shape having the longitudinal direction and the lateral direction, the circuit overlapping the pad in the plan view and electrically coupled to the pad, the lead-out wiring led out from the outer edge on the longitudinal side of the pad along the lateral direction of the pad, and the via group electrically coupling the lead-out wiring and the wiring of the circuit and not overlapping the pad in the plan view are formed on the active surface of the integrated circuit device. In the mounting step, the bump is formed on the pad of the integrated circuit device, the integrated circuit device is disposed such that the active surface thereof faces a surface of the package, and the terminal provided on the surface of the package and the bump formed on the pad are coupled by the ultrasonic bonding in which the longitudinal direction of the pad serves as the vibration direction.

According to such a manufacturing method, the pad of the integrated circuit device and the terminal provided on the surface of the package can be bonded using the ultrasonic vibration. The pad of the integrated circuit device is formed in a shape having a longitudinal direction and the lead-out wiring of the pad is led out from the outer edge on the longitudinal side of the pad, and thus the occurrence of problems caused by the stress caused by the ultrasonic vibration can be prevented. Therefore, it is possible to provide a manufacturing method that is capable of achieving an appropriate lead-out wiring electrically coupling the pad and the circuit while reducing the area of the integrated circuit device by disposing the circuit so as to overlap with the pad.

Although the present embodiment has been described in detail above, it will be easily understood by those skilled in the art that many modifications can be made without substantially departing from novel matters and effects of the present disclosure. Therefore, all such modifications are included in the scope of the present disclosure. For example, a term described at least once together with a different term having a broader meaning or the same meaning in the specification or the drawings can be replaced with the different term in any place in the specification or the drawings. All combinations of the present embodiment and the modifications are also included in the scope of the present disclosure. The integrated circuit device, and the configurations, operations, the manufacturing methods, and the like of the device are not limited to those described in the present embodiment, and various modifications can be made.

What is claimed is:

1. An integrated circuit device comprising:
   a pad that has a shape having a longitudinal direction and a lateral direction;
   a circuit that overlaps the pad in a plan view, and that is electrically coupled to the pad;
   a lead-out wiring that is led out from an outer edge on a longitudinal side of the pad along the lateral direction of the pad; and
   a via group that electrically couples the lead-out wiring and a wiring of the circuit and that does not overlap the pad in the plan view,
   wherein the lead-out wiring has a shape whose longitudinal direction is the longitudinal direction of the pad.

2. The integrated circuit device according to claim 1, wherein
   the wiring is a wiring of a metal layer below a metal layer of the pad, and
   the wiring partially overlaps with the pad in the plan view.

3. The integrated circuit device according to claim 2, wherein
   the wiring is a wiring of a metal layer disposed at an interval of one or more layers from the metal layer of the pad.

4. The integrated circuit device according to claim 1, wherein
   a plurality of vias of the via group are provided side by side along the longitudinal direction of the lead-out wiring.

5. The integrated circuit device according to claim 1, wherein
   the lead-out wiring has a shape in which corner portions are chamfered in the plan view.

6. The integrated circuit device according to claim 1, wherein
   the pad is an input pad to which an input signal is input, and
   the circuit is an I/O circuit to which the input signal is input from the input pad.

7. The integrated circuit device according to claim 1, wherein
   the pad is an output pad that outputs an output signal, and
   the circuit is an output buffer circuit that outputs the output signal to the output pad.

8. The integrated circuit device according to claim 1, wherein
   the pad is a ground pad to which ground is supplied, and
   the circuit is a reference voltage generation circuit that generates a reference voltage.

9. The integrated circuit device according to claim 1, further comprising
   a second lead-out wiring that is led out from an outer edge on a lateral side of the pad along the longitudinal direction of the pad, wherein
   the second lead-out wiring is formed of a metal layer in the same layer as the pad.

10. The integrated circuit device according to claim 1, further comprising
    a second pad that has a shape having a longitudinal direction and a lateral direction, wherein
    the longitudinal direction of the pad and the longitudinal direction of the second pad are the same direction.

11. A device comprising:
    the integrated circuit device according to claim 1;
    a package in which the integrated circuit device is housed;
    a terminal that is provided on a surface of the package; and
    a bump that electrically couples the terminal and the pad of the integrated circuit device.

12. The device according to claim 11, wherein
    the bump is ultrasonically bonded to the terminal, and
    the longitudinal direction of the pad is a longitudinal direction of the bump.

13. The device according to claim 11, further comprising
    a resonator that is housed in the package, wherein the integrated circuit device includes an oscillation circuit that generates an oscillation signal by vibrating the resonator.

14. A manufacturing method for a device, the device including an integrated circuit device and a package in which the integrated circuit device is housed, the method comprising:
a manufacturing step of the integrated circuit device; and
a mounting step of mounting the integrated circuit device on the package, wherein
in the manufacturing step,
a pad having a shape having a longitudinal direction and a lateral direction, a circuit overlapping the pad in a plan view and electrically coupled to the pad, a lead-out wiring led out from an outer edge on a longitudinal side of the pad along the lateral direction of the pad, and a via group electrically coupling the lead-out wiring and a wiring of the circuit and not overlapping the pad in the plan view are formed on an active surface of the integrated circuit device, and
in the mounting step,
a bump is formed on the pad of the integrated circuit device,
the integrated circuit device is disposed such that the active surface faces a surface of the package, and
a terminal provided on the surface of the package and the bump formed on the pad are coupled by ultrasonic bonding in which the longitudinal direction of the pad serves as a vibration direction.

15. An integrated circuit device comprising:
a pad that has a shape having a longitudinal direction and a lateral direction;
a circuit that overlaps the pad in a plan view, and that is electrically coupled to the pad;
a first lead-out wiring that is led out from an outer edge on a longitudinal side of the pad along the lateral direction of the pad;
a second lead-out wiring that is led out from an outer edge on a lateral side of the pad along the longitudinal direction of the pad; and
a via group that electrically couples the first lead-out wiring and a wiring of the circuit and that does not overlap the pad in the plan view, wherein
the second lead-out wiring is formed of a metal layer in the same layer as the pad.

16. The integrated circuit device according to claim 15, wherein
the wiring is a wiring of a metal layer below a metal layer of the pad, and
the wiring partially overlaps with the pad in the plan view.

17. The integrated circuit device according to claim 16, wherein
the wiring is a wiring of a metal layer disposed at an interval of one or more layers from the metal layer of the pad.

18. The integrated circuit device according to claim 15, wherein
The first lead-out wiring has a shape whose longitudinal direction is the longitudinal direction of the pad.

19. The integrated circuit device according to claim 18, wherein
a plurality of vias of the via group are provided side by side along the longitudinal direction of the first lead-out wiring.

20. The integrated circuit device according to claim 15, wherein
the first lead-out wiring has a shape in which corner portions are chamfered in the plan view.

\* \* \* \* \*